United States Patent [19]
Iwata et al.

[11] Patent Number: 5,621,649
[45] Date of Patent: Apr. 15, 1997

[54] METHOD FOR ANALYZING ELECTROMAGNETIC FIELD

[75] Inventors: Keiji Iwata; Hosei Hirano, both of Kawasaki; Takatsugu Ueyama; Kenji Umetsu, both of Futtsu, all of Japan

[73] Assignee: Nippon Steel Corporation, Tokyo, Japan

[21] Appl. No.: 93,538

[22] Filed: Jul. 19, 1993

[30] Foreign Application Priority Data

| | | | |
|---|---|---|---|
| Jul. 20, 1992 | [JP] | Japan | 4-214503 |
| Aug. 26, 1992 | [JP] | Japan | 4-250815 |
| Nov. 10, 1992 | [JP] | Japan | 4-324848 |
| Nov. 10, 1992 | [JP] | Japan | 4-324849 |
| Feb. 26, 1993 | [JP] | Japan | 5-062970 |

[51] Int. Cl.$^6$ .................................................. G01R 29/08
[52] U.S. Cl. .................. 364/483; 324/76.11; 324/200
[58] Field of Search .............................. 324/72, 76.11, 324/260, 263; 364/481, 483, 578

[56] References Cited

U.S. PATENT DOCUMENTS

5,315,233  5/1994  Sakiyama et al. ....................... 324/72

FOREIGN PATENT DOCUMENTS

5113458  5/1993  Japan.

OTHER PUBLICATIONS

Ueyama et al., "Development of 3-D electro-magnetic field analysis code Fledy", Oct. 1991 (Abstract only).

Tanaka et al., "An Edge Element for Boundary Element Method Using Vector Variables", Mar. 1992.

Ueyama et al., "3-D Analyses of Electromagnetic Field Including Conductors Connected with Voltage Sources", Mar. 1993.

Marshall et al., *Electromagnetic Concepts & Applications*, 1987, Chapter 7, pp. 179–210, and p. 112.

"Three Dimensional Eddy Current Calculation Using Edge Elements for Magnetic Vector Potential", A. Kameari Oct., 1988.

"A Finite–Element Analysis of a Three–Dimensional Electromagnetic Field and its Gauge Conditions", M. Hano, 1989.

"Supercomputer", Murata, Oguni and Karaki, 1985.

"Scripts for Lectures of the Second Seminar on Numerical Analysis of Electromagnetic Field", Fujiwara, 1991.

*Primary Examiner*—Emanuel T. Voeltz
*Assistant Examiner*—Patrick J. Assovad
*Attorney, Agent, or Firm*—Kenyon & Kenyon

[57] ABSTRACT

Analysis of an electromagnetic field in a region including an electric conductor having an arbitrary shape is efficiently and accurately performed with a computer. A value of electric potential at a predetermined portion of the electric conductor or a value of the normal component of an electric current density vector to the cross section of a predetermined portion of the electric conductor is used as an initial condition. The distribution of exciting current density vectors in the electric conductor is obtained form the initial condition so as to meet the condition of continuity of electric current. The electromagnetic field of the region is analyzed by using the obtained distribution of exciting current density vectors.

8 Claims, 28 Drawing Sheets

FIG. 6
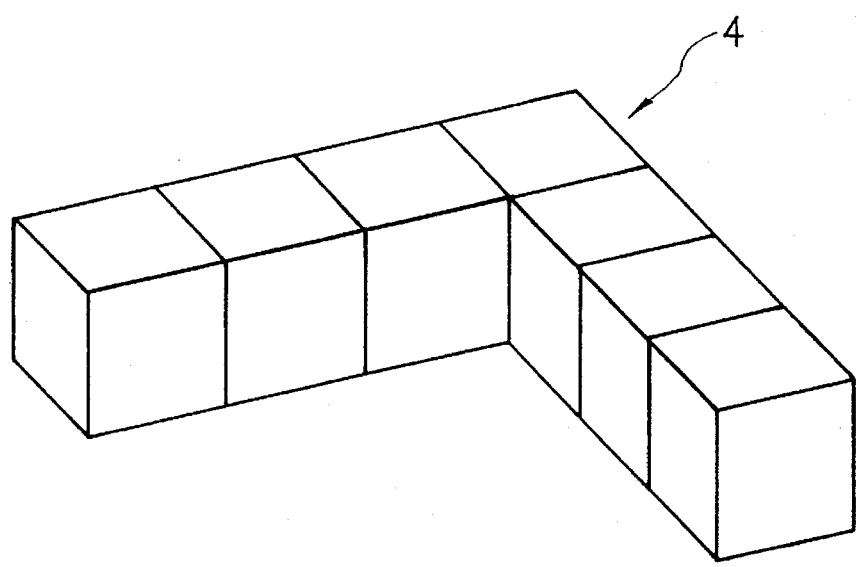
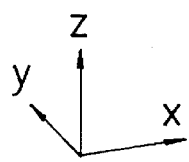

FIG. 7
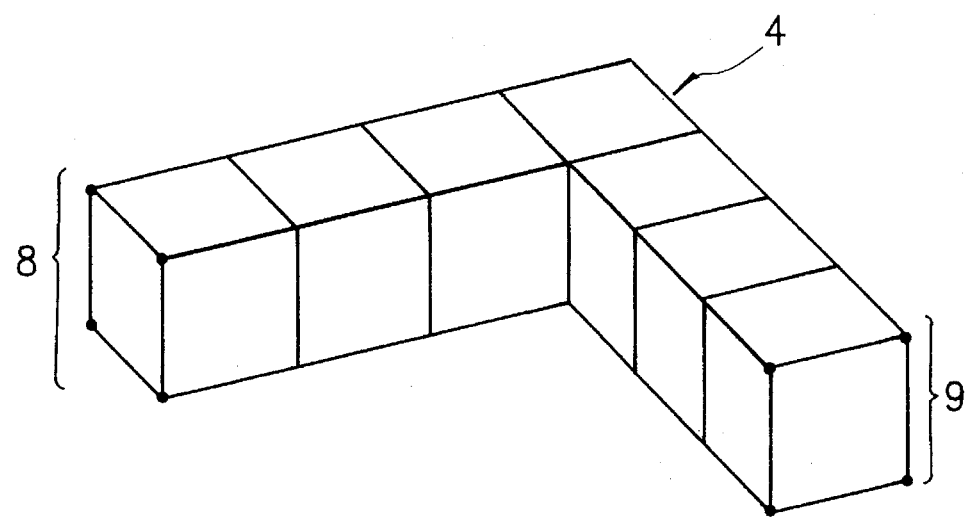
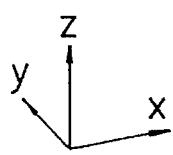

□ CALCULATED VALUE
● MEASURED VALUE

F I G. 12
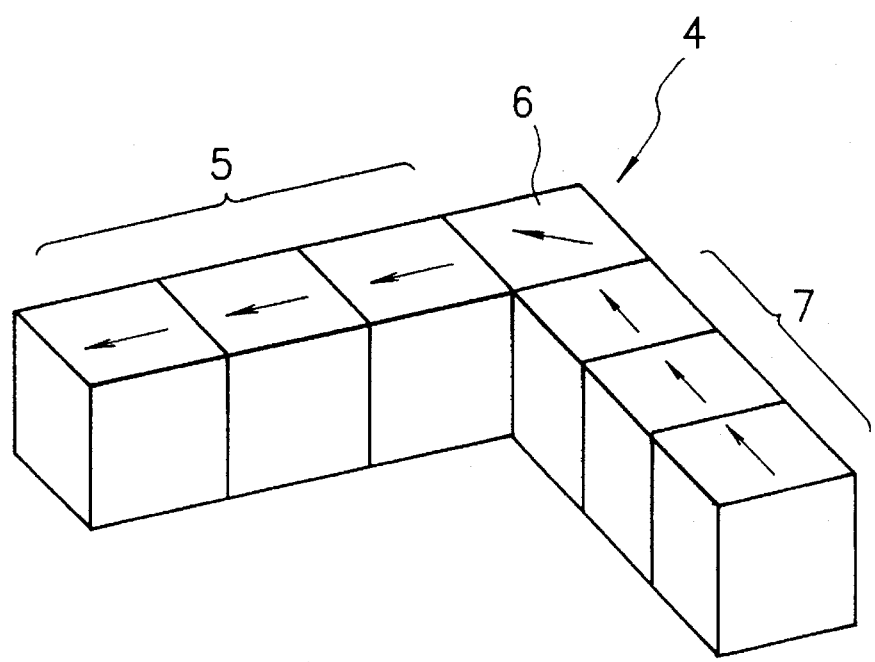

□ $10^{-4}$
● $10^{-8}$

F I G. 19
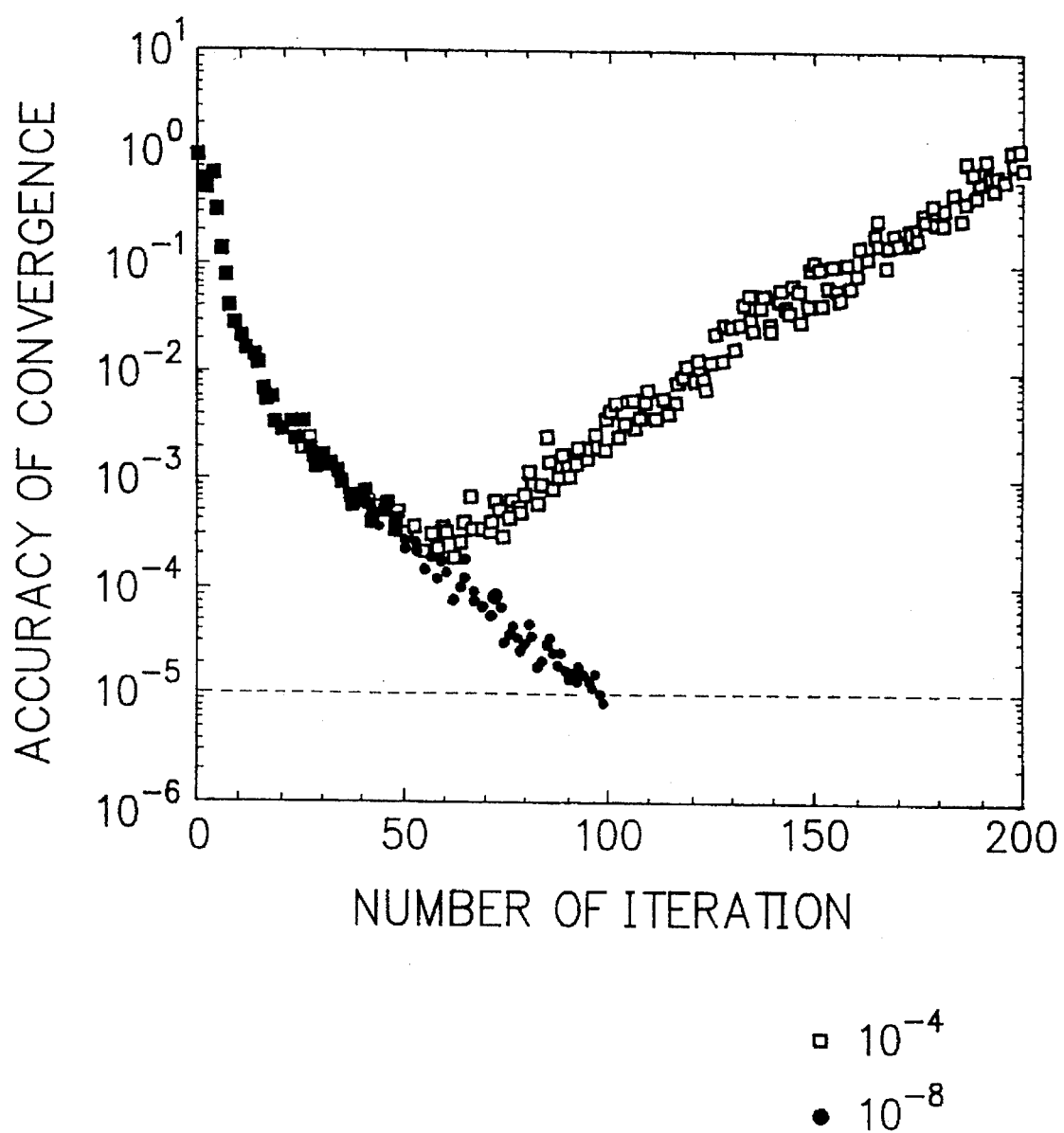

F I G. 23
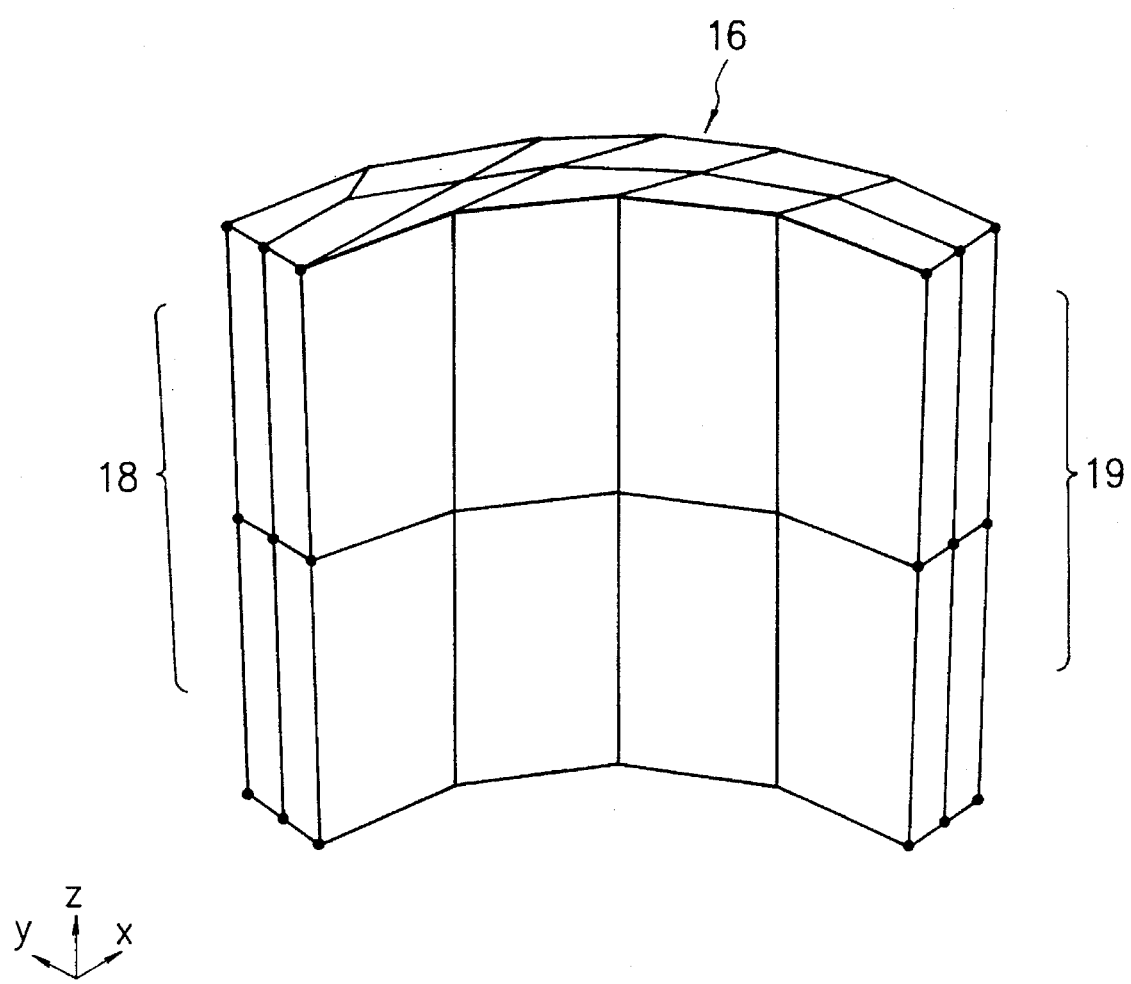

F I G. 24
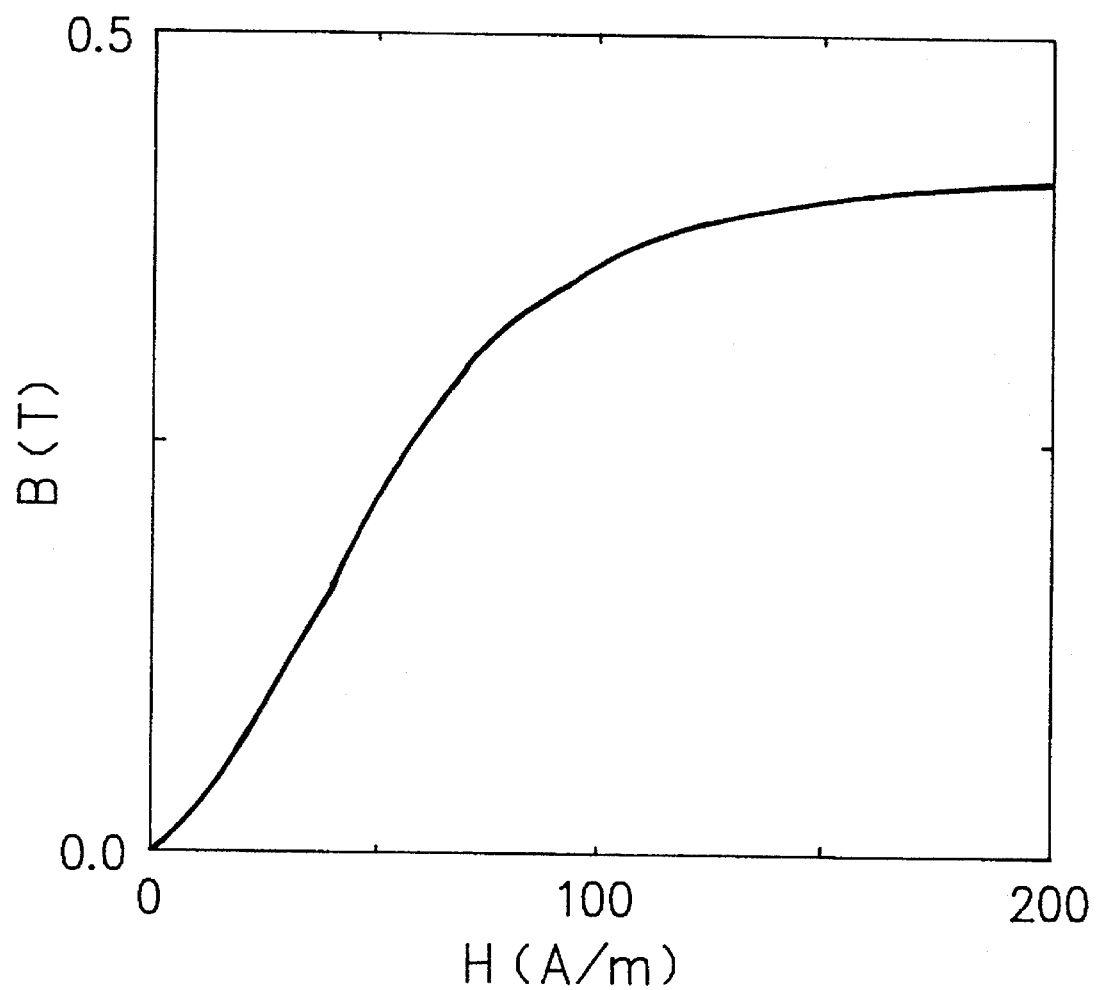

□ CALCULATED VALUE
—•— MEASURED VALUE

METHOD FOR ANALYZING ELECTROMAGNETIC FIELD

BACKGROUND OF THE INVENTION

1. Field of the Invention

The present invention relates to a method for analyzing an electromagnetic field, which is useful in design of an electronic or electric equipment (e.g., a transformer, a reactor, or a motor) utilizing an electromagnetic phenomenon.

2. Description of the Related Art

The following series of equations or equivalent equations obtained by transforming the equations with another variable are used as fundamental equations for an electromagnetic field analysis.

$$\vec{\nabla} \times \vec{H} = \vec{J}_0 + \vec{J}_e \tag{1}$$

$$\vec{B} = \vec{\nabla} \times \vec{A} \tag{2}$$

$$\vec{E} = -\frac{\partial \vec{A}}{\partial t} + \vec{\nabla}\phi \tag{3}$$

$$\vec{B} = \mu \vec{H} \tag{4}$$

$$\vec{J}_e = \rho \vec{E} \tag{5}$$

where each letter or symbol with an arrow (→) represents a vector having components in three directions in a space, $\vec{A}$ is the vector potential [V·s/m], $\phi$ is the scalar potential [V], $\vec{J}_0$ is the exciting current density [A/m²], $\vec{J}_e$ is the eddy current density [A/m²], $\rho$ is the electric conductivity [S/m], and $\mu$ is the permeability [H/m].

To solve these equations in practice, techniques such as a finite-element method are used. According to the finite-element method, a region of interest is spatially divided into a large number of sub-regions each having a relatively simple shape called "element", and a target unknown function is approximated by a relatively simple function on each element. More specifically, a potential to be obtained is developed with an approximate function on each element, and the potential is then obtained so as to minimize the energy within the region by using the variation principle. An approximate method using an approximate function for giving an unknown variable 2 on an edge of each element 1 is called edge-element approximation, as shown in FIG. 2. FIG. 2 exemplifies a hexahedral element 1. However, another edge-element approximation equally applies to an element having any other shape. An electromagnetic field analysis using an edge-element approximation is described in, e.g., "A. KAMEARI: Three Dimensional Eddy Current Calculation Using Edge Elements for Magnetic Vector Potential; Applied Electromagnetics in Materials: pp. 225–236, 1988".

An electromagnetic field analysis using an edge-element approximate function will be described below. The approximate function used in an edge-element approximation belongs to a function space in which the gauge transformation for electromagnetic field is held, as described in "M. Hano: a finite-element analysis of a three-dimensional electromagnetic field and its gauge conditions; Materials of the society for the study of electromagnetic theory; EMT-89-45, 1989". For this reason, a gauge for nullifying the scalar potential $\phi$ in equation (3) can be employed. Therefore, $\phi=0$ is assumed in the following description. A discrete formation of the fundamental equations for electromagnetic field is made by using an edge-element approximate function in accordance with the Galerkin's method equivalent to the variation principle. The vector potential in the element is approximated as follows:

$$\vec{A} = \sum_q^m \vec{N}_q A_q \tag{6}$$

where $\vec{N}_q$ is the edge-element approximate function (vector function), $A_q$ is the unknown variable, the suffix q or suffix k (to be described later) represents an edge number, and m represents the total number of edges of each element. The Galerkin's method is applied to equation (1). That is, $\vec{N}_k$ is multiplied with equation (1) to perform the volume integration within the element, the thus-obtained integral equations for all the elements are added to each other, and the resulting equation is rearranged with the Gauss' theorem and the vector formulas to yield the following equation:

$$\sum_e \left[ \int_{Ve} (\vec{\nabla} \times \vec{N}_k) \cdot (\mu^{-1} \vec{\nabla} \times \vec{A}) dv + \int_{Ve} \vec{N}_k \cdot \sigma \frac{\partial \vec{A}}{\partial t} dv + \int_{Se} \vec{n} \cdot (\vec{H} \times \vec{N}_k) ds \right] = \sum_e \int_{Ve} \vec{N}_k \cdot \vec{J}_0 dv \tag{7}$$

where $$\int_{Ve} dv$$

is the integration within the element, $$\sum_e$$

is the sum for all the elements, $\vec{n}$ is the unit vector normal to the boundary plane, and $$\int_{Se} ds$$

is the surface integration on the element surface.

The above surface integral term is generally set zero. In that case, unless a boundary condition is specified on a boundary outside the region of interest, a solution for nullifying the surface integral term can be obtained. Let the surface integral term be zero in the following description. When equation (6) is substituted into equation (7), and, for example, a backward difference is applied to the time differential term, simultaneous linear equations having $A_q$ as unknown variable and an integral term as coefficient are obtained.

$$\sum_e \left[ \sum_q^m \left\{ \int_{Ve} (\vec{\nabla} \times \vec{N}_k) \cdot (\mu^{-1} \vec{\nabla} \times \vec{N}_q) dv + \int_{Ve} \vec{N}_k \cdot \frac{\sigma}{\Delta t} \vec{N}_q dv \right\} A_q \right] = \sum_e \left[ \sum_q^m \left\{ \int_{Ve} \vec{N}_k \cdot \vec{J}_0 dv + \right. \right. \tag{8}$$

$$\int_{Ve} \vec{N_k} \cdot \frac{\sigma}{\Delta t} \vec{N_q} dv A'_q \Big\}\Big]$$

where $\Delta t$ is the time difference, and $A_q$ is the $A_q$ value $\Delta t$ before. In this case, the time differential term is represented by difference approximation, but complex approximation (jω method: j is the imaginary unit, and ω is the angular frequency) can be used alternatively.

When the above discreted equation is applied to the region of interest, the electromagnetic field generated in the region can be analyzed. That is, equation (8) is calculated on the basis of input data such as shape data, physical property data, time data, boundary condition data, and the exciting current density $\vec{J_0}$ applied to the electric conductor included in the region, all of which are input as analysis initial conditions. At this time, the integrations of equation (8) are calculated by, e.g., numerical integration. When the integrations are executed to obtain simultaneous linear equations for the respective elements and they are added for all the elements, comprehensive simultaneous linear equations are obtained. These are solved by using the Gauss' elimination method as a direct method, the incomplete Cholesky conjugate gradient method as an iteration method, or the like, and finally the target potential can be calculated. The Gauss' elimination method, the incomplete Cholesky conjugate gradient method, and the like are described in, e.g., "Murata, Oguni, and Karaki: Supercomputer; 1985". The edge-element approximation has the highest accuracy at a high speed among the electromagnetic field analysis techniques because the edge-element approximation is a physically accurate approximation. Therefore, the edge-element approximation is very effective for an electromagnetic field analysis in design of an electronic or electric equipment.

In the electromagnetic field analysis described above, the exciting current density $\vec{J_0}$ is a quantity which must be given as an initial condition for analysis. It must satisfy the condition of continuity of current of the next equation required by the Maxwell's equations:

$$\vec{\nabla} \cdot \vec{J}_o = 0 \quad (9)$$

In a conventional electromagnetic field analysis using an edge-element approximation, if the exciting current density $\vec{J_0}$ given does not satisfy the condition of continuity of current, no convergence can be attained in the incomplete Cholesky conjugate gradient method which is generally used for solving simultaneous linear equations. Thus, the electromagnetic field cannot be calculated. For example, as reported in "Fujiwara: Scripts for lectures of the second seminar on numerical analysis of electromagnetic field; p. 7, 1991", when a region including a rectangular electric conductor is divided into elements of rectangular parallelopipeds, and data which do not satisfy the condition of continuity of current of equation (9) in the electric conductor are input to a computer to perform the analysis, no convergence can be obtained in the incomplete Cholesky conjugate gradient method. That is, in a conventional analysis technique, to accurately analyze an electromagnetic field generated in a region including an electric conductor, an exciting current density $\vec{J_0}$ which is a vector quantity and meets the condition of continuity of current in equation (9) must be given. If the shape of the electric conductor is simple, the exciting current density $\vec{J_0}$ to be given can be relatively easily determined so as to meet the condition of continuity of current, and it can be input to the computer. However, when the shape of the electric conductor or the element divisions are complicated, the exciting current density $\vec{J_0}$ cannot be easily determined in order to meet the condition of continuity of current. It is then impossible to input an initial condition of the exciting current density $\vec{J_0}$ to the computer.

After all, in a conventional electromagnetic field analysis method, to analyze an electromagnetic field of a region including a relatively complicated electric conductor structure, an exciting current density $\vec{J_0}$ which is a vector quantity and meets the condition of continuity of current within the electric conductor cannot be input as an initial condition in a computer. As a result, the electromagnetic field cannot be analyzed with high accuracy.

SUMMARY OF THE INVENTION

It is an object of the present invention to provide a method for analyzing an electromagnetic field of a region including an electric conductor having an arbitrary shape, by using, e.g., an edge-element approximation, capable of giving the distribution of exciting current density vectors in the electric conductor so as to meet the condition of continuity of current.

In order to achieve the above object of the present invention, there is provided a method for analyzing an electromagnetic field of a region including an electric conductor with a computer, in which a value of electric potential at a predetermined portion of the electric conductor is used as an initial condition, the distribution of exciting current density vectors in the electric conductor is calculated on the basis of the value of electric potential so as to meet the condition of continuity of electric current, and the electromagnetic field of the region is calculated on the basis of the distribution of exciting current density vectors.

The above and other objects, features and advantages of the invention will be apparent from the following detailed description which is to be read in conjunction with the accompanying drawings.

BRIEF DESCRIPTION OF THE DRAWINGS

FIG. 6 is a view showing an electric conductor portion divided into elements according to the first to third embodiments of the present invention;

FIG. 7 is a view showing nodes in the electric conductor in FIG. 6, at each of which an electric potential is applied as an initial condition according to a method of the first embodiment of the present invention;

FIG. 12 is a view showing a state in which exciting current density vectors are applied to the respective elements of the electric conductor portion in FIG. 6 in accordance with a conventional method;

FIG. 19 is a graph showing a state of convergence in a magnetic field calculation process, which changes depending on different calculation convergent accuracies of the comprehensive simultaneous equations associated with the electric potential in the calculation process of the distribution of current density vectors according to the fifth embodiment of the present invention;

FIG. 23 is a view showing nodes in a divided electric conductor portion, at each of which an electric potential is applied as an initial condition according to the seventh embodiment of the present invention;

FIG. 24 is a graph showing initial magnetization characteristics of the magnetic material according to the seventh to ninth embodiments of the present invention;

DETAILED DESCRIPTION OF THE INVENTION

Figure 1:
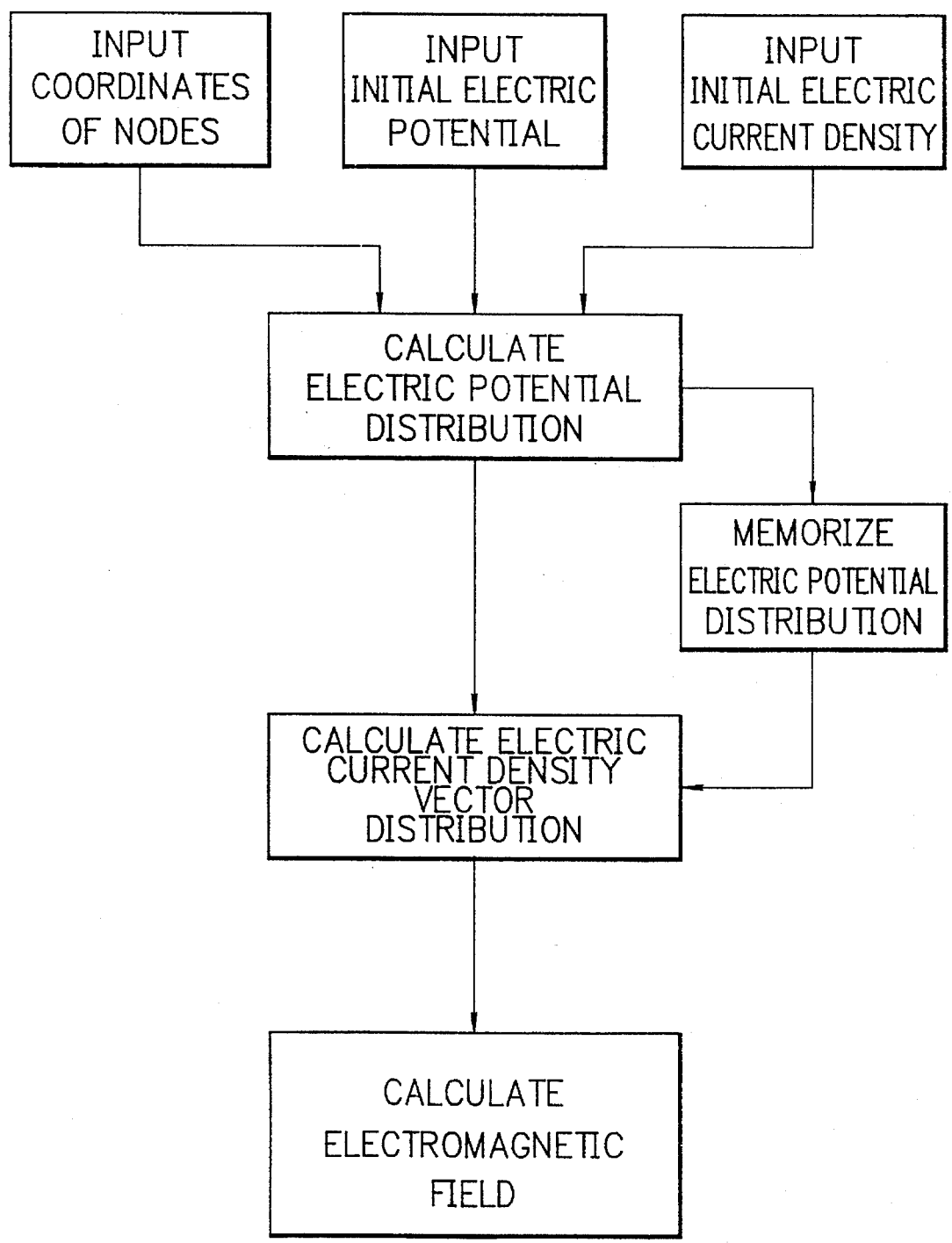
FIG. 1 is a flow chart showing the schematic flow of a method for analyzing an electromagnetic field.
Figure 2:
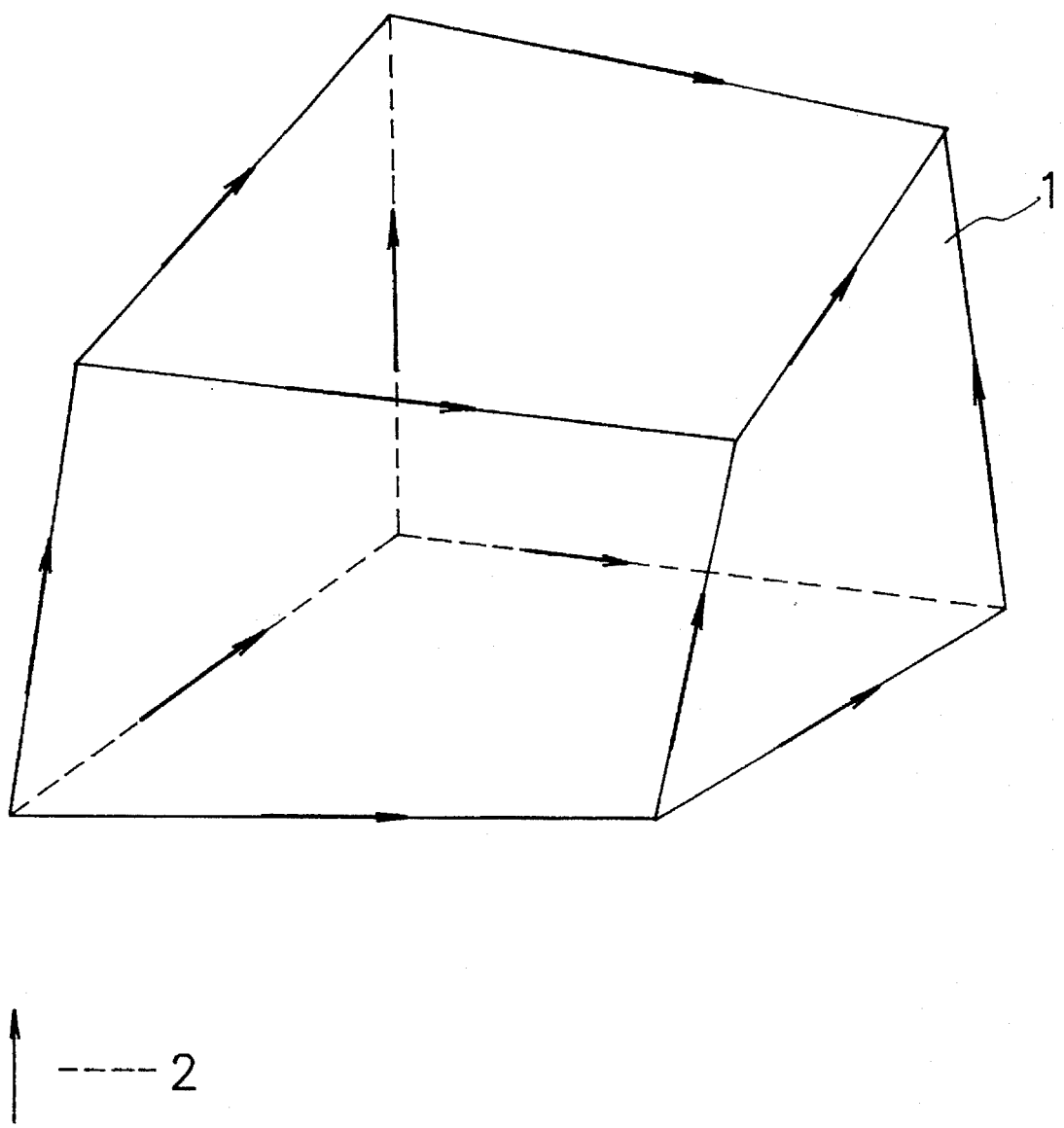
FIG. 2 is a view for explaining edge-element approximation.

The present invention will be generally described. A current distribution which meets the condition of continuity of current in an electric conductor is obtained by solving the below equation (12), which is derived from the above equation (9) of continuity of current, the Ohm's law defined as follows:

$$\vec{J}_0 = \sigma_0 \vec{E} \tag{10}$$

and an equation obtained by expressing the electric field by a potential $\Phi$:

$$\vec{E} = -\vec{\nabla}\Phi \tag{11}$$

therefore $$\vec{\nabla} \cdot (\sigma_0 \vec{\nabla}\Phi) = 0 \tag{12}$$

where $\sigma_0$ is the electric conductivity of the electric conductor. Equation (12) is solved in accordance with, e.g., a finite-element method for node elements. The potential $\Phi$ in an element is approximated and developed as follows:

$$\Phi = \sum_{i}^{n} v_i \Phi_i \tag{13}$$

where $v_i$ is a scalar function, $\Phi_i$ is the unknown variable, the suffix i or suffix j (to be described later) represents a node number, and n is the total number of nodes corresponding to each element. The Galerkin's method is applied to equation (12). That is, $v_i$ is multiplied with equation (12) to perform volume integration within each element, integral equations of all the elements are added to each other, and the result is rearranged by using the vector formulas, thereby obtaining the following equation:

$$\sum_{e} \left\{ \int_{Ve} \vec{\nabla}v_j \cdot \sigma_0 \vec{\nabla}\Phi dv - \int_{Se} v_j(\sigma_0\vec{\nabla}\Phi) \cdot \vec{n}ds \right\} = 0 \tag{14}$$

The surface integration of the second term of equation (14) becomes zero under the condition that no current flows out from the surface of the electric conductor. Assuming that this term is zero, a substitution of equation (13) into equation (14) yields simultaneous linear equations having $\Phi_i$ as unknown variable and an integral term as coefficient:

$$\sum_e \left[ \sum_i^n \left\{ \int_{Ve} \vec{\nabla} v_j \cdot \sigma_0 \vec{\nabla} v_i dv - \int_{Se} v_j (\sigma_0 \vec{\nabla} v_i) \cdot \vec{n} ds \right\} \Phi_i \right] = 0 \quad (15)$$

On the other hand, as for an element having a cross section of the electric conductor to which the initial condition is applied, $-\sigma_0 \vec{\nabla} \Phi \cdot \vec{n}$ represents the normal component of a current density vector to the cross section of the electric conductor. For this reason, the value of the normal component of the current density vector to the cross section, which is input as the initial condition, is substituted in equation (15) to calculate the surface integration of the second term. The integration in the element in equation (15) is performed by numerical integration to form simultaneous equations for the respective elements. The integral values of all the elements are added to each other to obtain comprehensive simultaneous linear equations. These are solved using the Gauss' elimination method as a direct method or the incomplete Cholesky conjugate gradient method as an iteration method to obtain values of the unknown variable $\Phi_i$. The current density vector distribution in the electric conductor portion can be calculated in accordance with equations (13), (11) and (10) using the known variable $\Phi_i$. Since equation (9) is indirectly used to obtain the current density vector distribution, the latter meets the continuity of current. In a detailed calculation sequence, in this stage, the calculated $\Phi_i$ data is stored in storage means such as a memory. In the subsequent calculation in the electromagnetic field analysis, the current density vector distribution in the electric conductor portion is calculated by using the $\Phi_i$ data in accordance with equations (13), (11) and (10). In this case, an element obtained upon dividing the region of interest into elements is conveniently used as the element (i.e., a small region) for the electric conductor portion. The region of interest is divided into elements so as to separate the electric conductor portion and the remaining portion. The electric potential or current density as the initial condition is, e.g., that at nodes or cross sections of both ends of the electric conductor in the region of interest.

The above sequence is defined as the first stage according to the present invention. Next, as the second stage, an electromagnetic field generated in the region of interest is analyzed. That is, the current. density vector distribution which meets the condition of continuity of current and is obtained from the calculation result of the first stage is applied to the exciting current density $\vec{J}_0$ included in the first term of the right-hand side of discreted equation (8) obtained by using, e.g., the edge-element approximate function. More specifically, a potential $\Phi_i$ calculated in the first stage for each node is read out from, e.g., a memory, and an exciting current density $\vec{J}_0$ at each integral point of each element of the electric conductor portion is calculated in accordance with equations (13), (11), and (10), and the first term including the exciting current density $\vec{J}_0$ is calculated by using, e.g., numerical integration. The similar integration operation is performed for the other term of equation (8) to obtain simultaneous linear equations for each element. The resulting values for all the elements are added to each other to obtain comprehensive simultaneous linear equations. These are solved by using the Gauss' elimination method or the incomplete Cholesky conjugate gradient method to analyze the electromagnetic field generated in the region including the electric conductor.

The above-described sequence according to the present invention is shown in a schematic flow of FIG. 1. According to the present invention, an exciting current density vector distribution in an electric conductor which meets the condition of continuity of current can always be obtained because the current density vector distribution within the conductor is obtained by using equation (9) of continuity of current. Using the resulting vector distribution, the electromagnetic field of the region including the electric conductor can be accurately analyzed in accordance with a finite-element method for edge elements.

Note that an "electric conductor" herein has an arbitrary cross-sectional shape such as a circle, an ellipse, or a polygon. The present invention is also applicable in consideration of linear and nonlinear characteristics and hystereses of magnetic material included in a region of interest.

According to the present invention, when an iteration method is used to solve simultaneous equations, the accuracy of convergence in the calculation of comprehensive simultaneous equations associated with the electric potential in the first stage must be set higher than the accuracy of convergence of comprehensive simultaneous equations associated with the vector potential or an unknown variable equivalent thereto in the second stage.

Preferred embodiments of the present invention will be described with reference to FIGS. 3 to 28.

Figure 3:
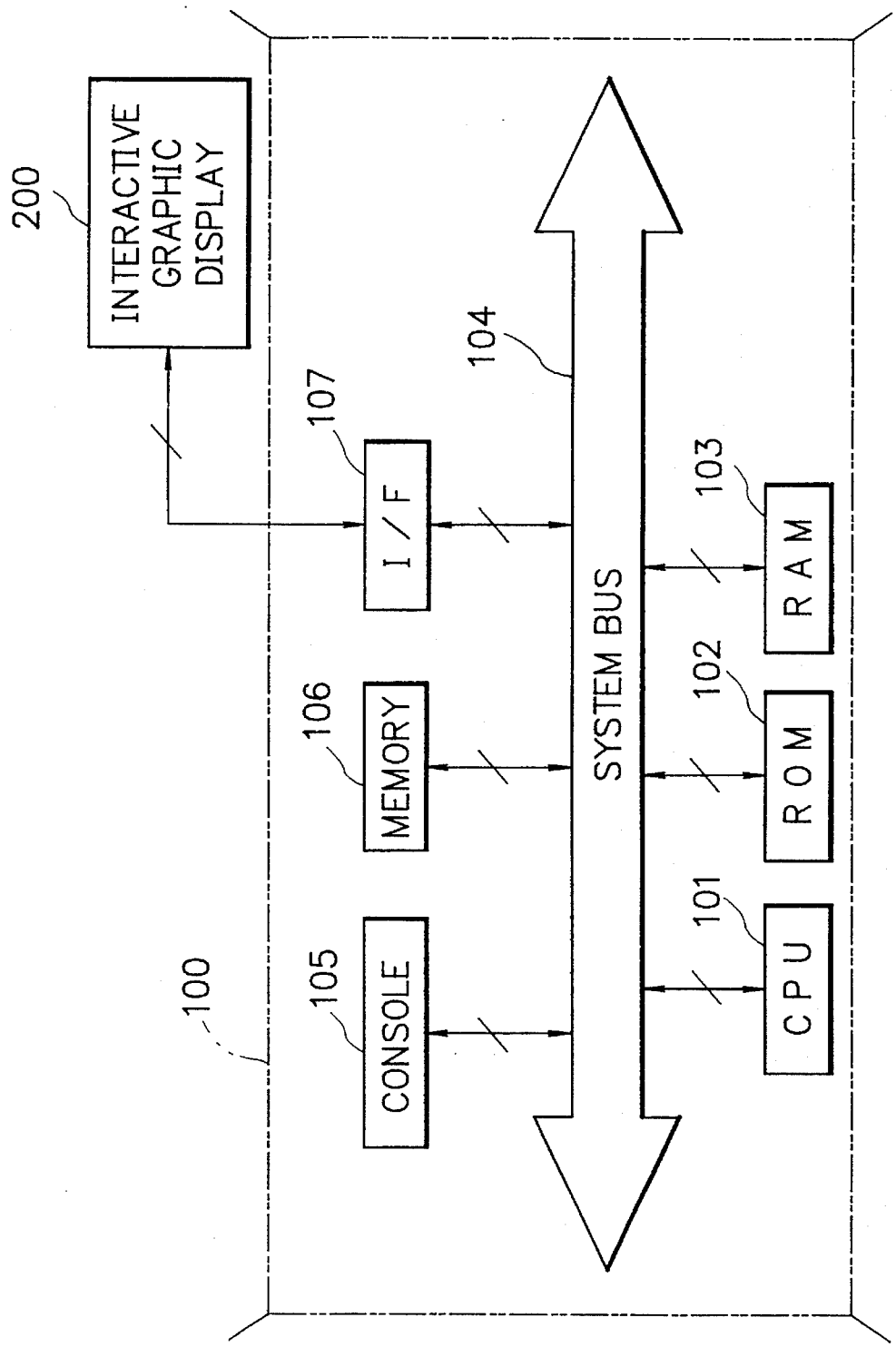
FIG. 3 is a block diagram showing the arrangement of a computer according to an embodiment of the present invention.

FIG. 3 shows the schematic arrangement of a computer used in an embodiment of the present invention. A computer 100 comprises a CPU 101 for performing overall control, a ROM 102 for storing programs, a RAM 103 mainly used as a temporary work area, an internal system bus 104 for exchanging data between the constituent devices, a console 105 for allowing an operator to input a command and displaying predetermined information, a memory 106 for storing various data, and an I/F (interface) 107 for connecting an interactive graphic display 200 and the system bus 104.

Figure 4:
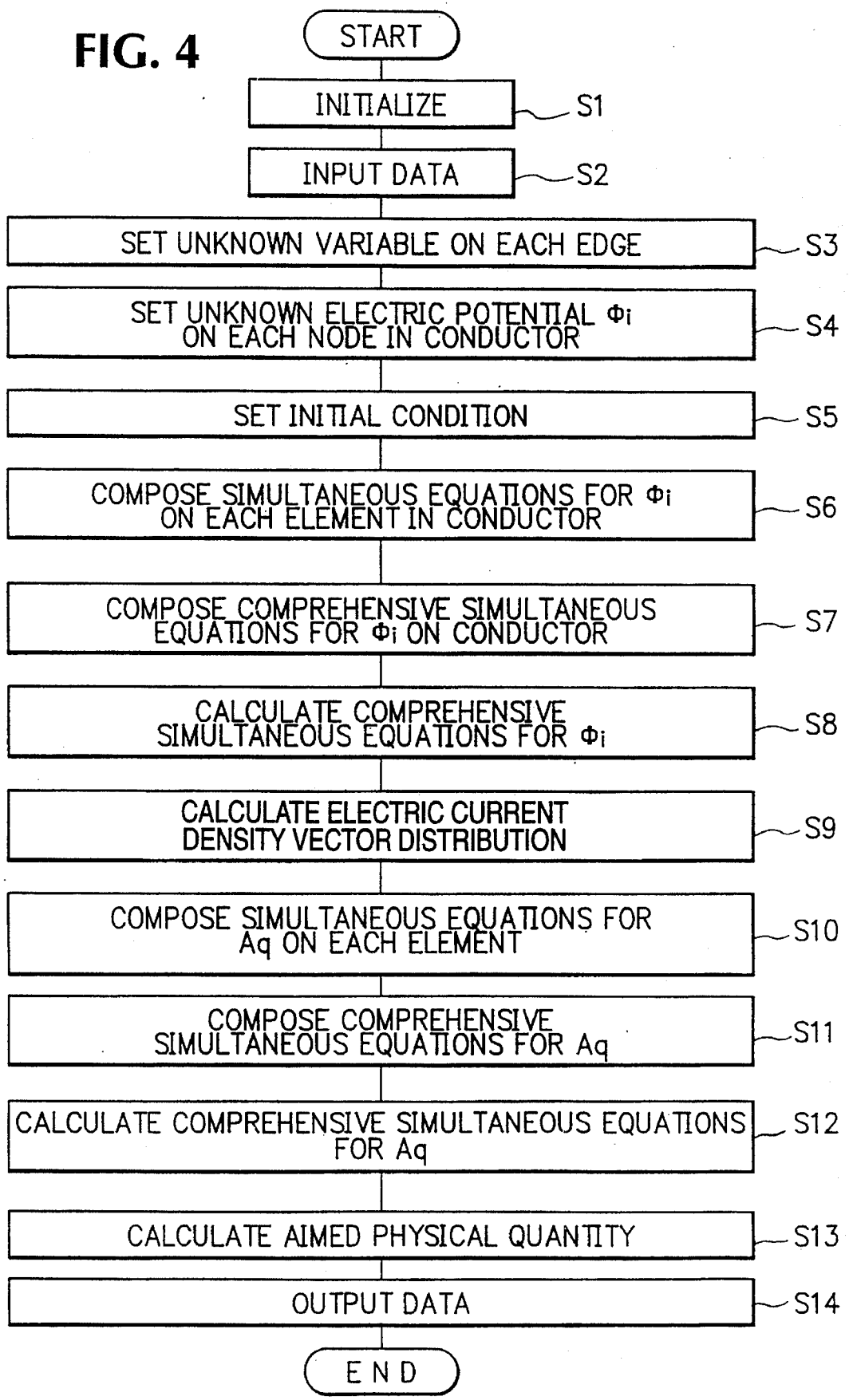
FIG. 4 is a flow chart showing a calculation sequence according to an embodiment of the present invention.

An operation flow of the CPU 101 will be described with reference to FIG. 4. After initialization is performed in step (S1), various data are input in step (S2). The input data include coordinate data of nodes of elements constituting a region of interest including an electric conductor, physical property data (e.g., electric conductivity and permeability) of the respective portions, boundary condition data of the region of interest, and a value or values of electric potential given as initial conditions to predetermined portions of the electric conductor or a value or values of the normal components of electric current densities given as initial conditions to cross sections of predetermined portions of the electric conductor. To calculate an electromagnetic field using a finite-element method for edge elements, an unknown variable is set on each edge of each element of the region in step (S3). An example of the unknown variable used in this case is $A_q$ obtained by approximating the vector potential $\vec{A}$ in equation (6). An electric potential $\Phi_i$ as the unknown variable in equation (13) is set on each node of the electric conductor portion in step (S4). In step (S5), the value or values of electric potential input in step (S2) are set on the predetermined nodes of the electric conductor portion, i.e., generally the nodes at both ends of the electric conductor in the region, or the value or values of the normal components of the current densities to the cross sections, which are input in step (S2), are set on the predetermined cross sections of the electric conductor portion, i.e., generally the cross sections of the both ends of the electric conductor in the region. In step (S6), simultaneous equations for each element of the electric conductor portion are composed from equation (15) derived from equation (12). At this time, the simultaneous equations obtained in step (S6) are composed in consideration of the condition of continuity of current because equation (12) includes the contents of equation (9) of continuity of current. In step (S7), those simultaneous equations are added for all the elements of the electric conductor portion to compose comprehensive simultaneous equations to be solved. In step (S8), the comprehensive simultaneous equations are solved by using the incomplete Cholesky conjugate gradient method as an iteration method, thereby obtaining a value of electric potential $\Phi_i$ on each node of the electric conductor portion. The value of electric potential $\Phi_i$ on each node of the electric conductor portion is stored in the memory. Note that the comprehensive simultaneous equations may be solved by a direct method.

An electromagnetic field is calculated by using a finite-element method for edge elements. In step (S9), a value of the exciting current density $\vec{J}_0$ at the integral point on each element of the electric conductor portion is obtained from equations (13), (11), and (10) by using the electric potential $\Phi_i$ of each node which has been stored in the memory. In step (S10), the value of the exciting current density $\vec{J}_0$ at the integral points on each element of the electric conductor portion, which is obtained in step (S9), is substituted in equation (8) to execute numerical integration. Equation (8) is thus calculated to compose simultaneous equations for each element. In step (S11), those are added for all the elements in the region to constitute comprehensive simultaneous equations to be solved. In step (S12), the comprehensive simultaneous equations are solved by using the incomplete Cholesky conjugate gradient method to obtain a value of the unknown variable $A_q$ on the edge of each element in the region. In step (S13), an aimed physical quantity such as values of magnetic flux densities B are obtained from the values of the unknown variable $A_q$ obtained in step (S12). In step (S14), for example, the magnetic flux density distribution data is output, and the processing is ended.

In the above processing, the scalar potential $\phi=0$ is assumed in the finite-element method for edge elements used to analyze the electromagnetic field. However, the method of the present invention is also applicable if $\phi \neq 0$. The processing described above exemplifies an analysis of a linear static electromagnetic field. However, the present invention is also applicable to an analysis of a nonlinear dynamic electromagnetic field.

The present invention will be described in more detail by way of its examples.

EXAMPLE 1

Figure 5:
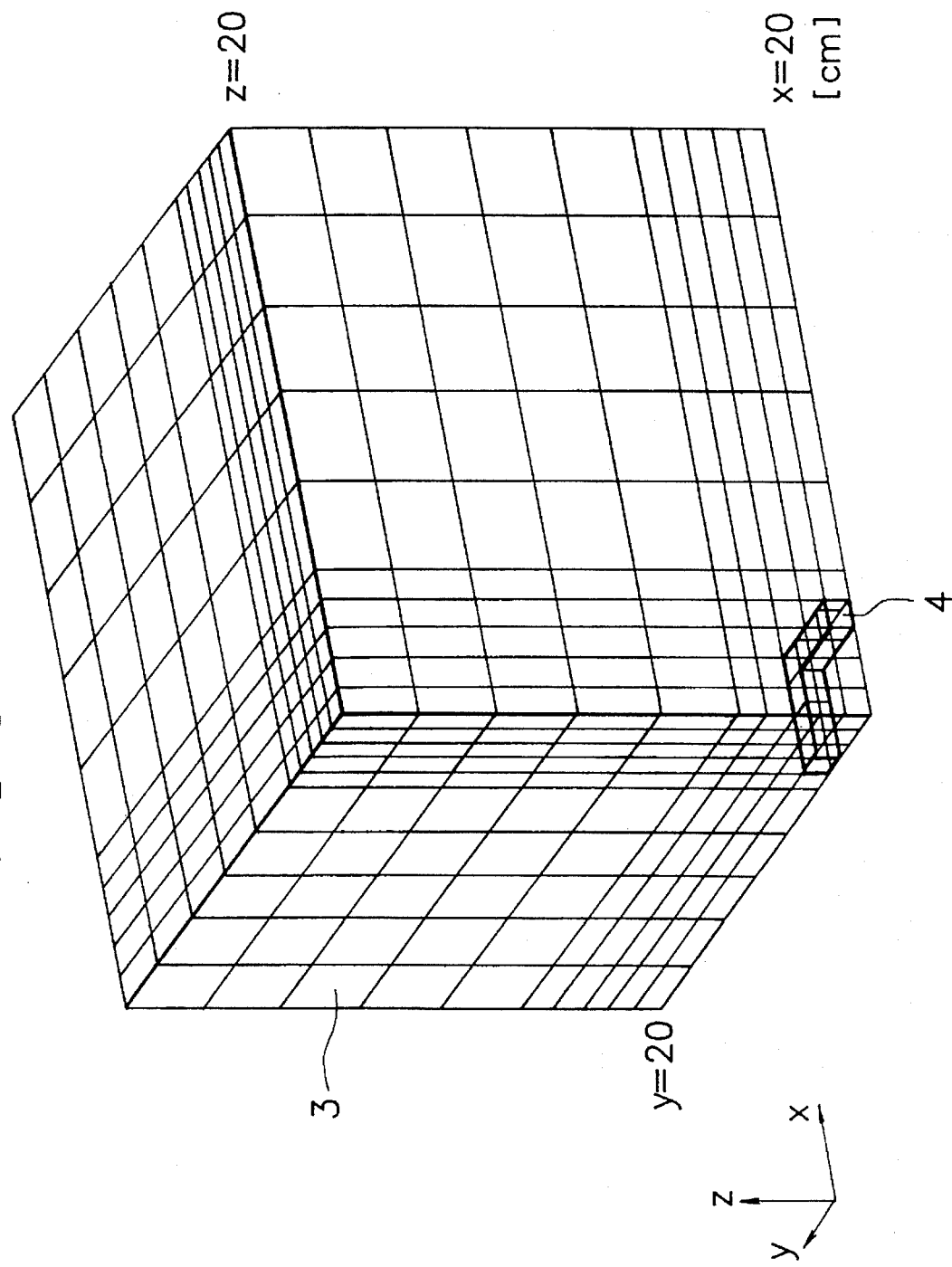
FIG. 5 is a view showing a region of interest according to the first to third embodiments of the present invention.

A magnetic field distribution formed by a rectangular electric conductor was analyzed. A region of interest was a ⅛ region in view of the model symmetry. The region of interest was divided into elements, as shown in FIG. 5. Of all the elements in FIG. 5, elements shown in FIG. 6 constituted the portion of the electric conductor 4. Reference numeral 3 in FIG. 5 denotes air. Referring to FIG. 5, the planes of x=0 and y=0 have the symmetrical boundary condition wherein edges on those planes are zero. The planes of x=20, y=20, and z=20 have the zero boundary condition. The plane of z=0 has the natural boundary condition.

Figure 8:
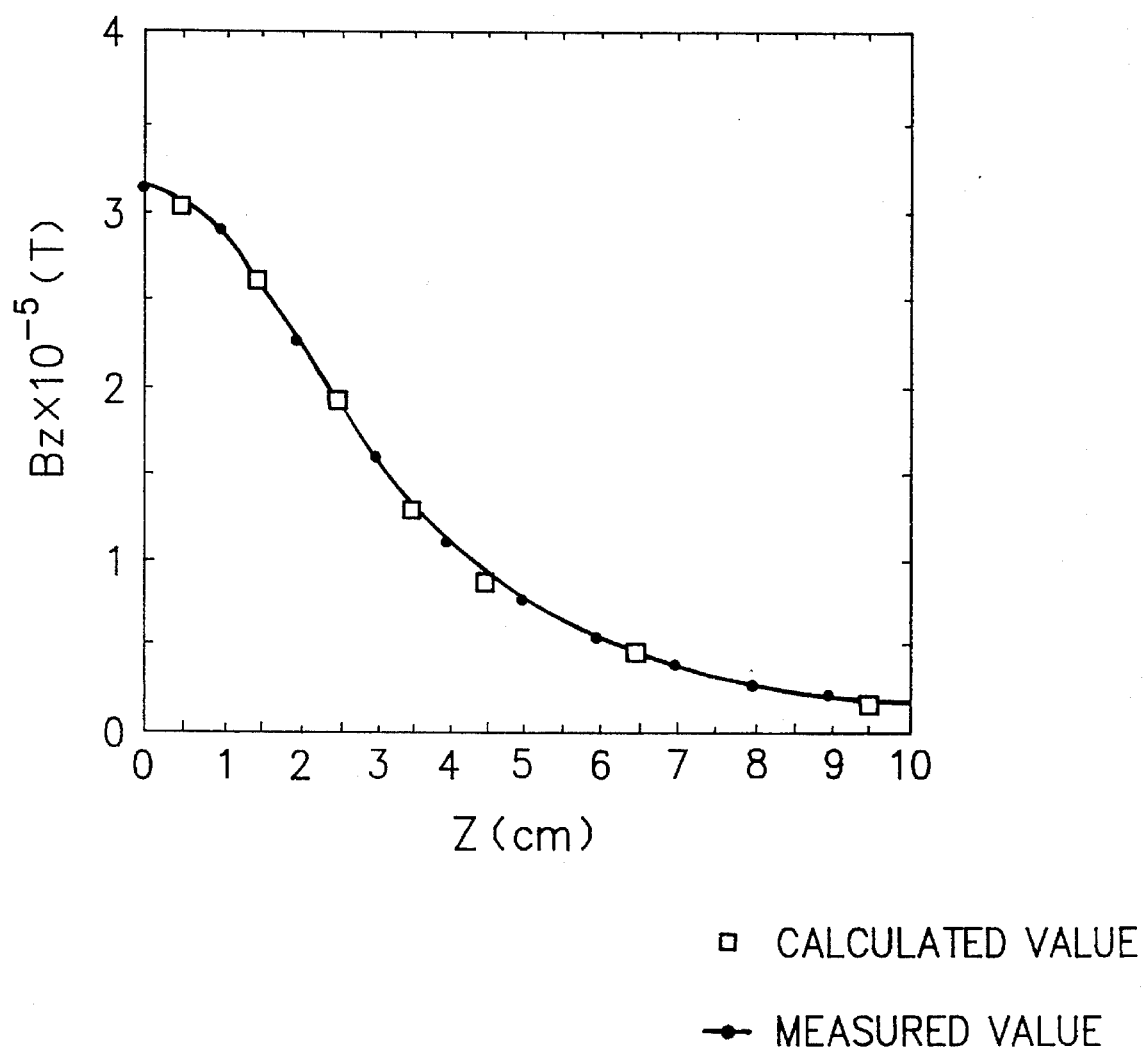
FIG. 8 is a graph for comparing calculated values with measured values according to the first embodiment of the present invention.
Figure 9:
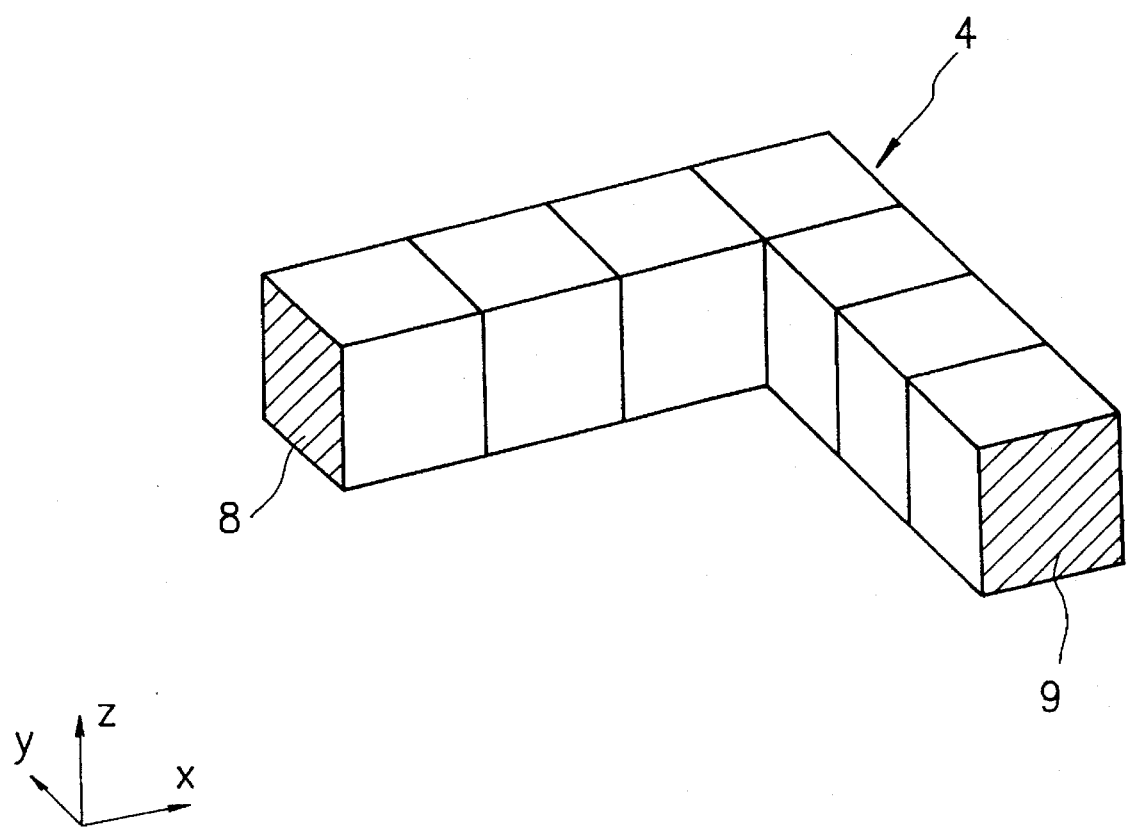
FIG. 9 is a view showing cross sections of the electric conductor portion in FIG. 6, at each of which a current density is applied as an initial condition according to a method of the second embodiment of the present invention.

In Example 1 were input a value 0 V of electric potential at nodes of a portion 8 in FIG. 7 and a value $6.3 \times 10^2$ V of electric potential at nodes of a portion 9 in FIG. 7 as initial conditions. A current density vector distribution which met the condition of continuity of current was obtained by using a finite-element method for node elements. An electromagnetic field was analyzed by edge-element approximation on the basis of the current density vector distribution. Convergence (with a convergence determination value of $10^{-5}$) of the incomplete Cholesky conjugate gradient method was obtained, and a result of the analysis shown in FIG. 8 was obtained. FIG. 8 shows the comparison between calculated values according to the present invention and measured values in the z-direction components of the magnetic flux density on the central axis. The calculated values according to the present invention accurately coincide with the measured values.

EXAMPLE 2

Figure 10:
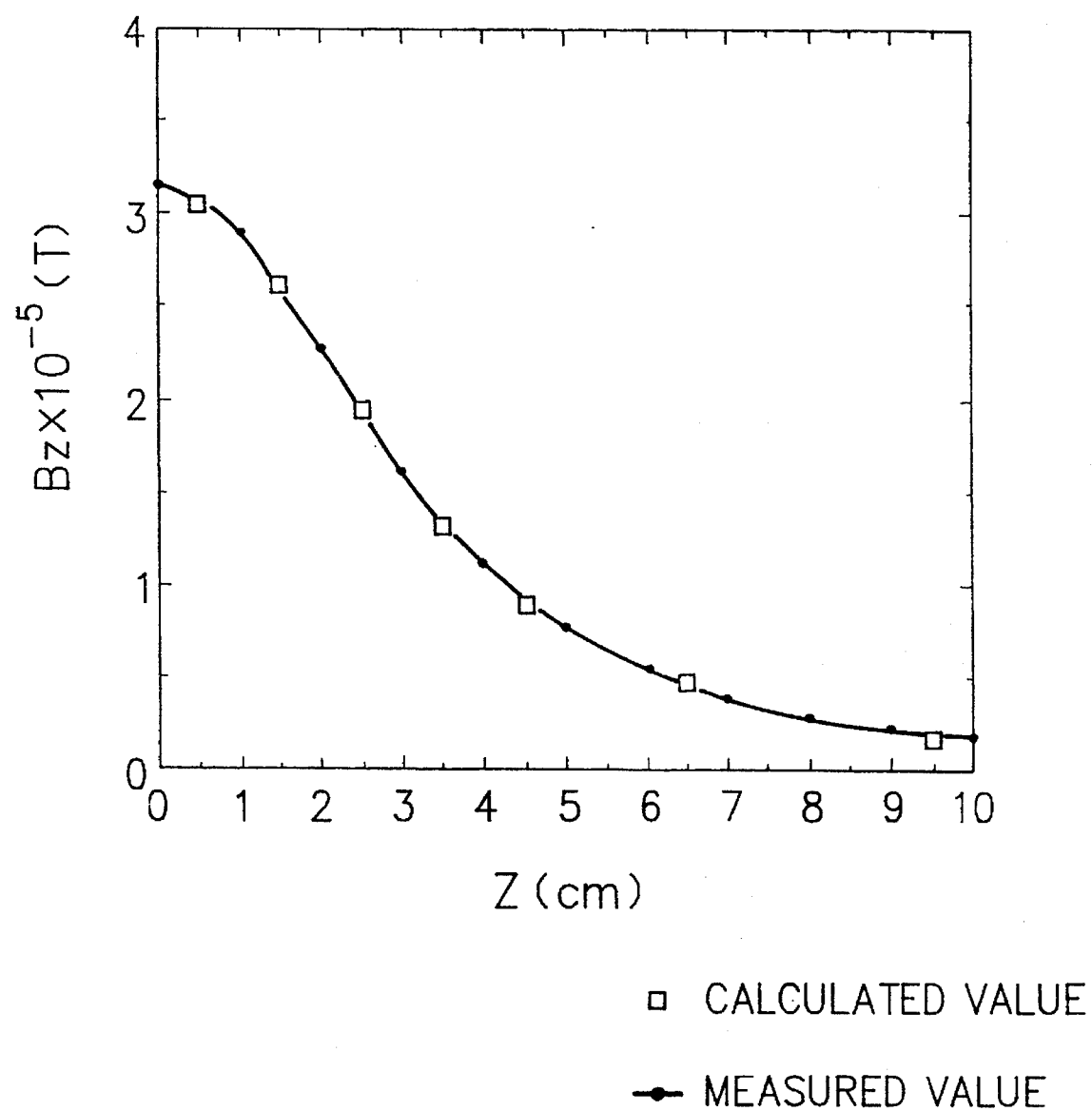
FIG. 10 is a graph for comparing calculated values with measured values according to the second embodiment of the present invention.
Figure 11:
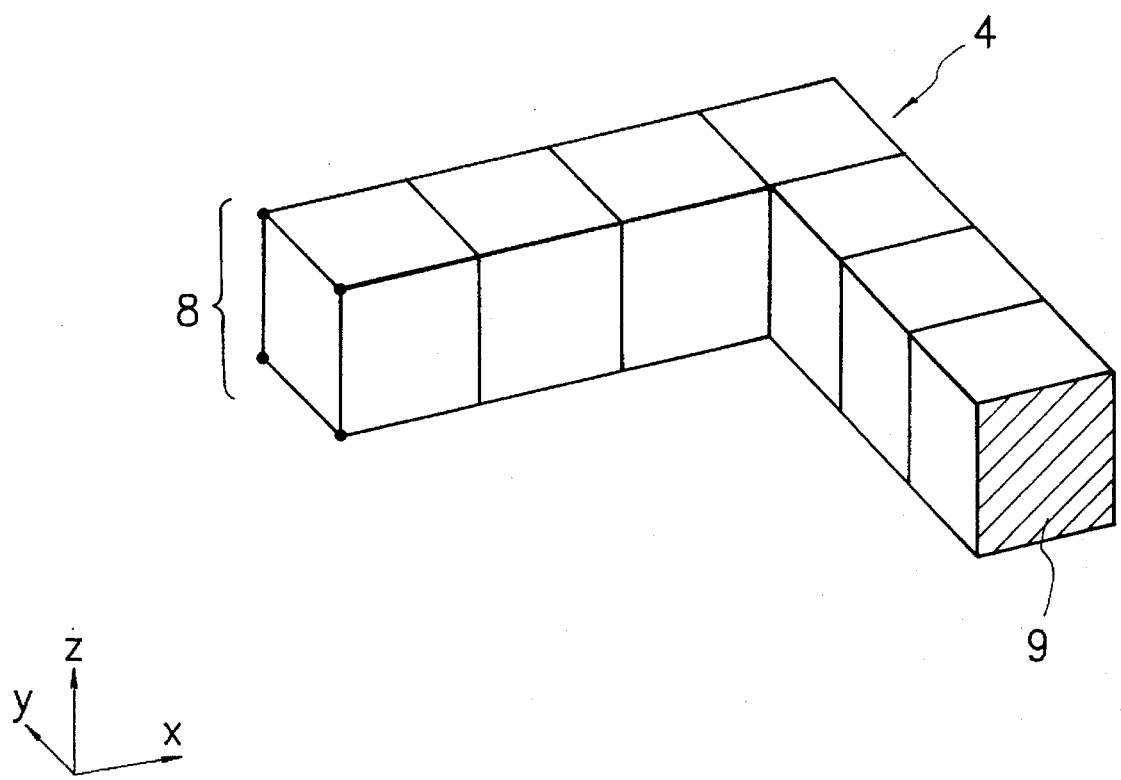
FIG. 11 is a view showing nodes in the electric conductor portion in FIG. 6, at each of which an electric potential is applied as an initial condition according to a method of the third embodiment of the present invention, and a cross section of the electric conductor portion, at which a current density is applied as an initial condition according to that method.

A magnetic field generated by a rectangular electric conductor as in Example 1 was analyzed. The region of interest and the boundary conditions of Example 2 were identical to those of Example 1. In Example 2, the normal component $10^4$ A/m$^2$ of a current density was input on the surfaces of portions 8 and 9 (FIG. 9) as an initial condition. A current density vector distribution which met the condition of continuity of current was obtained by using a finite-element method for node elements. An electromagnetic field was analyzed by edge-element approximation on the basis of the current density vector distribution. Convergence (with a convergence determination value of $10^{-5}$) of the incomplete Cholesky conjugate gradient method was obtained, and a result of the analysis shown in FIG. 10 was obtained. FIG. 10 shows the comparison between calculated values according to the present invention and measured values in the z-direction components of the magnetic flux density on the central axis. The calculated values according to the present invention accurately coincide with the measured values.

EXAMPLE 3

A magnetic field generated by a rectangular electric conductor as in Example 1 was analyzed. The region of interest and the boundary conditions of Example 3 were identical to those of Example 1. In Example 3, an electric potential of 0 V was input as an initial condition to nodes of a portion 8 in FIG. 11 and the normal component $10^4$ A/m$^2$ of a current density was input as an initial condition on the surface of a portion 9 in FIG. 11. A current density vector distribution which met the condition of continuity of current was obtained by using a finite-element method for node elements. An electromagnetic field was analyzed by edge-element approximation on the basis of the current density vector distribution. Convergence (with a convergence determination value of $10^{-5}$) of the incomplete Cholesky conjugate gradient method was obtained, and a result of the analysis as in FIG. 10 was obtained.

Comparative Example 1

An exciting current density of $10^4$ A/m$^2$ was input such that each element at a portion 5 in FIG. 12 was set to $(-10^4, 0, 0)$, the element at a portion 6 in FIG. 12 was set to $(-10^4/\sqrt{2}, 10^4/\sqrt{2}, 0)$, and each element at a portion 7 in FIG. 12 was set to $(0, 10^4, 0)$ (unit: A/m$^2$) to analyze a magnetic flux density distribution generated by a rectangular electric conductor as in Examples 1 to 3 by using edge-element approximation. As the result, no convergence of the incomplete Cholesky conjugate gradient method used to solve simultaneous linear equations could be obtained, and no solutions were obtained.

EXAMPLE 4

Figure 13:
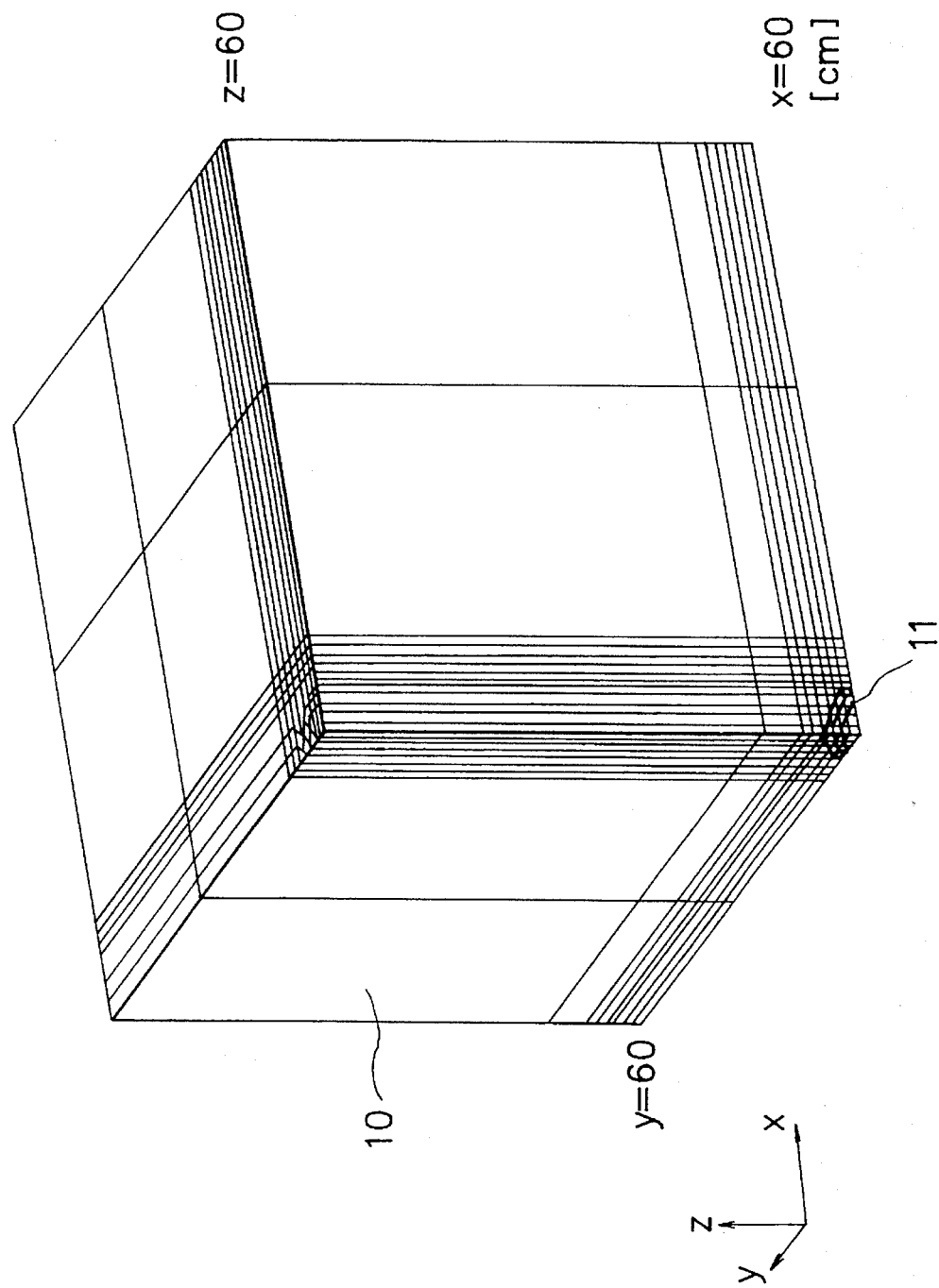
FIG. 13 is a view showing a region of interest according to the fourth to sixth embodiments of the present invention.

A magnetic field distribution formed by a ring-like electric conductor was analyzed. A region of interest was a 1/8 region in view of the model symmetry. The region of interest was divided into elements, as shown in FIG. 13. Of all the elements in FIG. 13, elements shown in FIG. 14 constituted the portion of the electric conductor 11. Reference numeral 10 in FIG. 13 denotes air. Referring to FIG. 13, the planes of x=0 and y=0 have the symmetrical boundary condition wherein edges on those planes are zero. The planes of x=60, y=60, and z=60 have the zero boundary condition. The plane of z=0 has the natural boundary condition.

Figure 14:
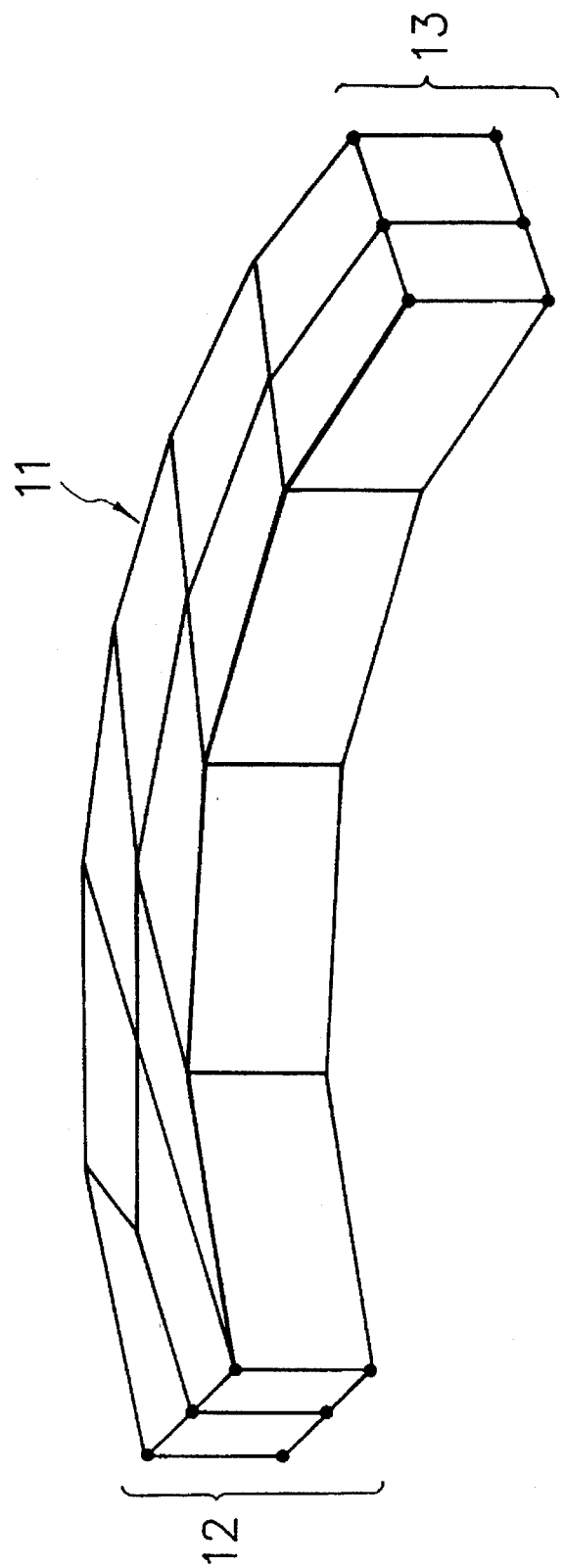
FIG. 14 is a view showing nodes in a divided electric conductor portion, at each of which a potential is applied as an initial condition according to the fourth embodiment of the present invention.
Figure 15:
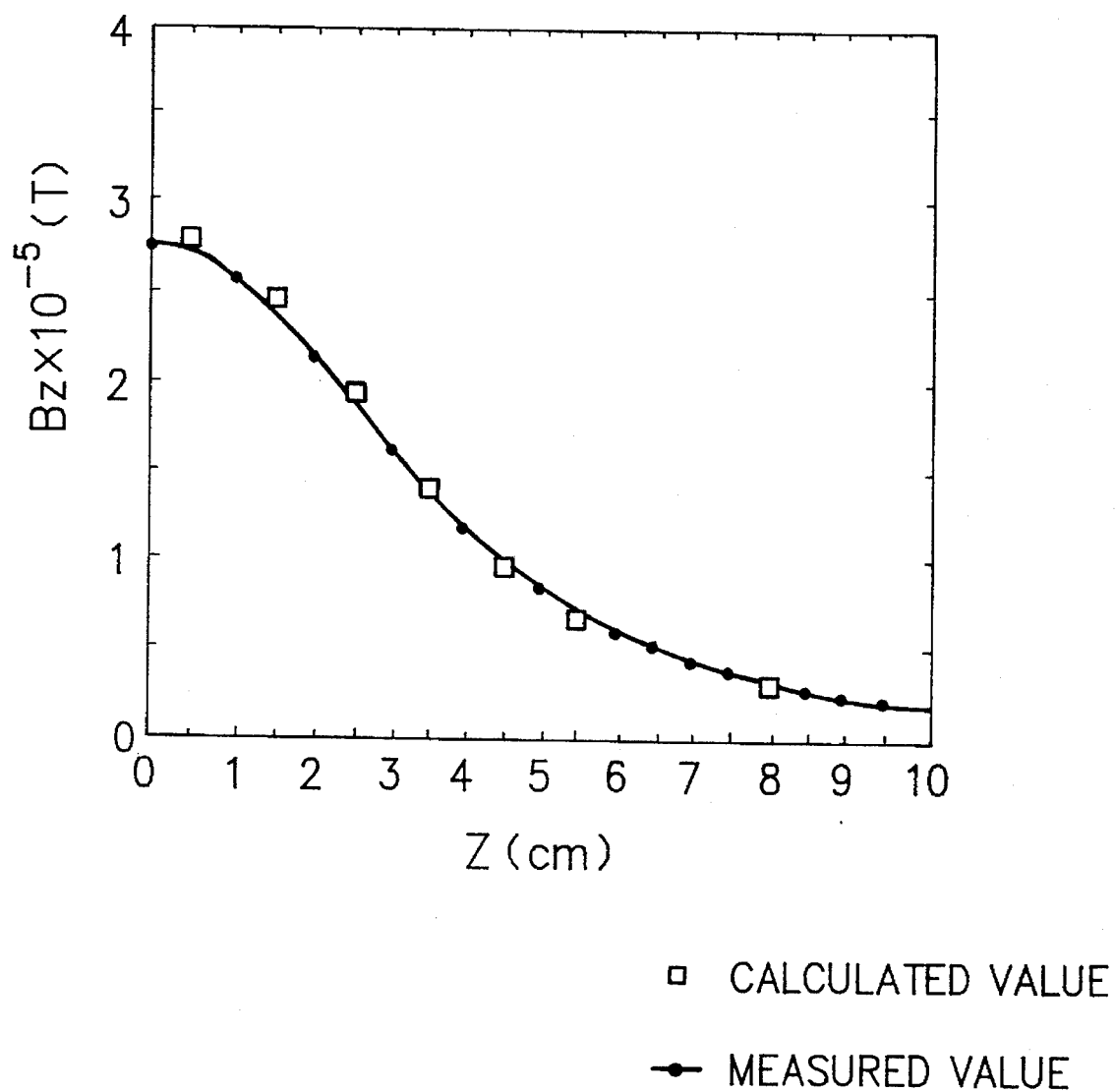
FIG. 15 is a graph for comparing calculated values with measured values according to the fourth embodiment of the present invention.

In Example 4 were input a value 0 V of electric potential at nodes of a portion 12 in FIG. 14 and a value $7.06 \times 10^2$ of electric potential at node of a portion 13 in FIG. 14 as initial conditions. A current density vector distribution which met the condition of continuity of current was obtained by using a finite-element method for node elements. An electromagnetic field was analyzed by edge-element approximation on the basis of the current density vector distribution. Convergence (with a convergence determination value of $10^{-5}$) of the incomplete Cholesky conjugate gradient method used to solve simultaneous linear equations was obtained, and a result of the analysis shown in FIG. 15 was obtained. FIG. 15 shows the comparison between calculated values according to the present invention and measured values in the z-direction components of the magnetic flux density on the central axis. According to the method of the present invention, even if the ring-like electric conductor is relatively complicatedly divided, as shown in FIG. 14, the analysis can be performed. In addition, as shown in FIG. 15, the calculated values according to the present invention accurately coincide with the measured values, thereby accurately analyzing the magnetic field.

Figure 16:
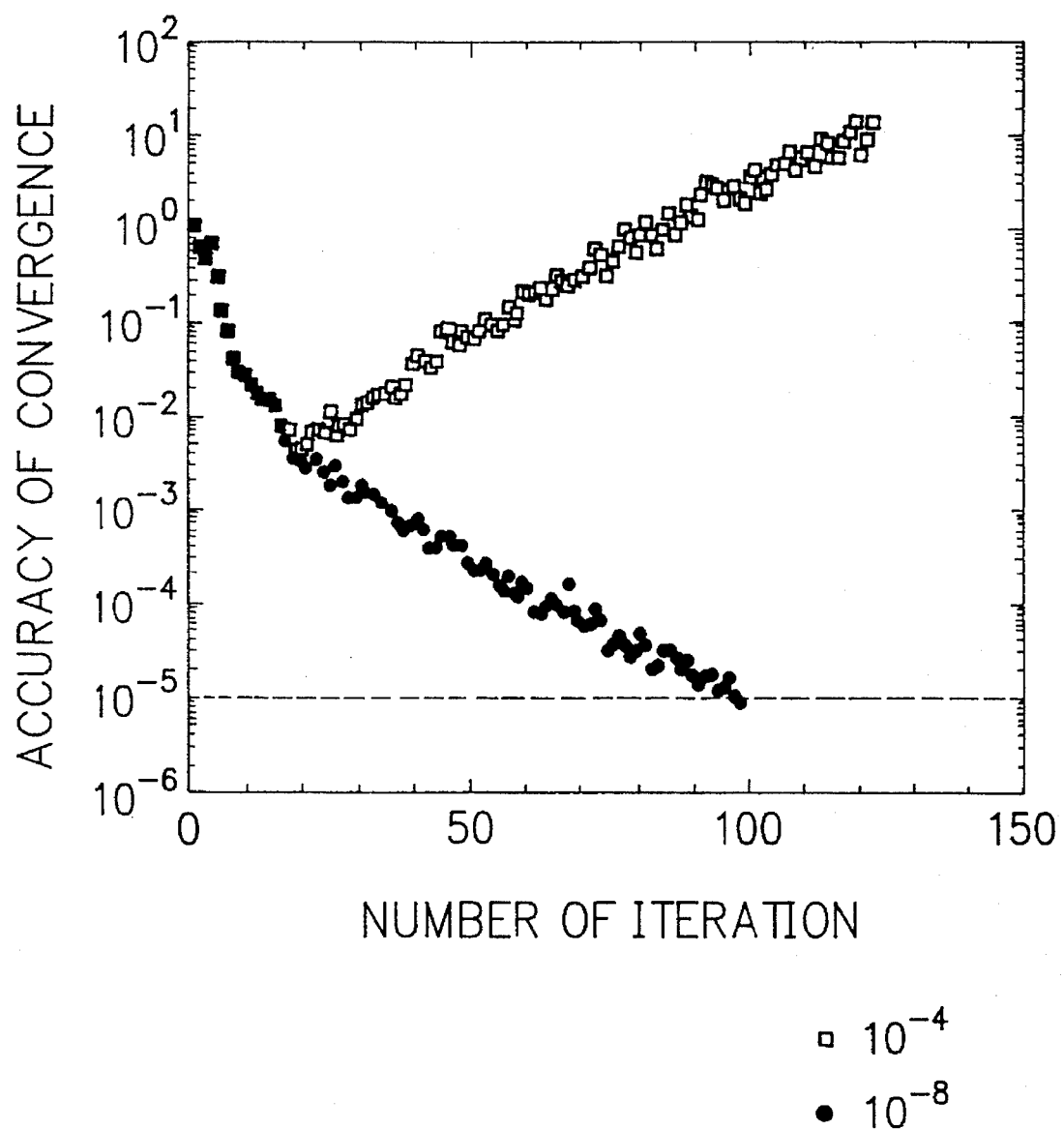
FIG. 16 is a graph showing a state of convergence in a magnetic field calculation process, which changes depending on different calculation convergent accuracies of the comprehensive simultaneous equations associated with the electric potential in the calculation process of the distribution of current density vectors according to the fourth embodiment of the present invention.

In this example, comprehensive simultaneous equations associated with the electric potential in the process for obtaining the current density vector distribution are solved by using the incomplete Cholesky conjugate gradient method. The convergence determination value which represented the accuracy of convergence in calculation was set to $10^{-8}$, and converged solutions with an increased accuracy were obtained. FIG. 16 shows the convergent state of the incomplete Cholesky conjugate gradient method in magnetic field calculations in this example when the accuracies of convergence of the comprehensive simultaneous equations associated with the electric potential in the current density vector calculations are $10^{-4}$ and $10^{-8}$. To obtain an aimed accuracy of convergence in the magnetic field calculation ($10^{-5}$ in this case), it is seen from FIG. 16 that the calculation accuracy of convergence of the comprehensive simultaneous equations associated with the electric potential for calculating the current density vectors must be higher than the aimed accuracy of convergence in the magnetic field calculation.

EXAMPLE 5

Figure 17:
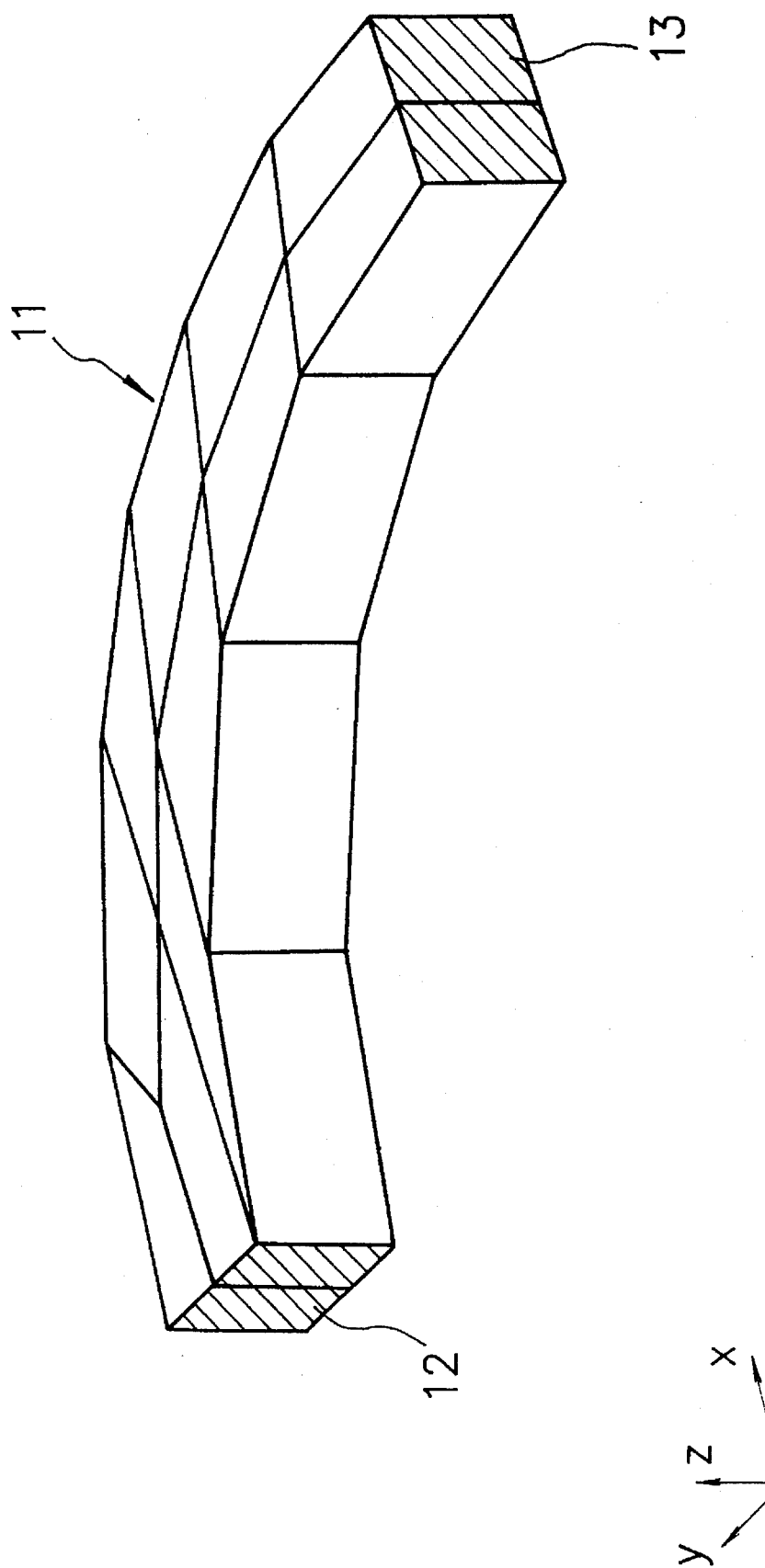
FIG. 17 is a view showing cross sections of a divided electric conductor portion, at each of which a current density is applied as an initial condition according to the fifth embodiment of the present invention.
Figure 18:
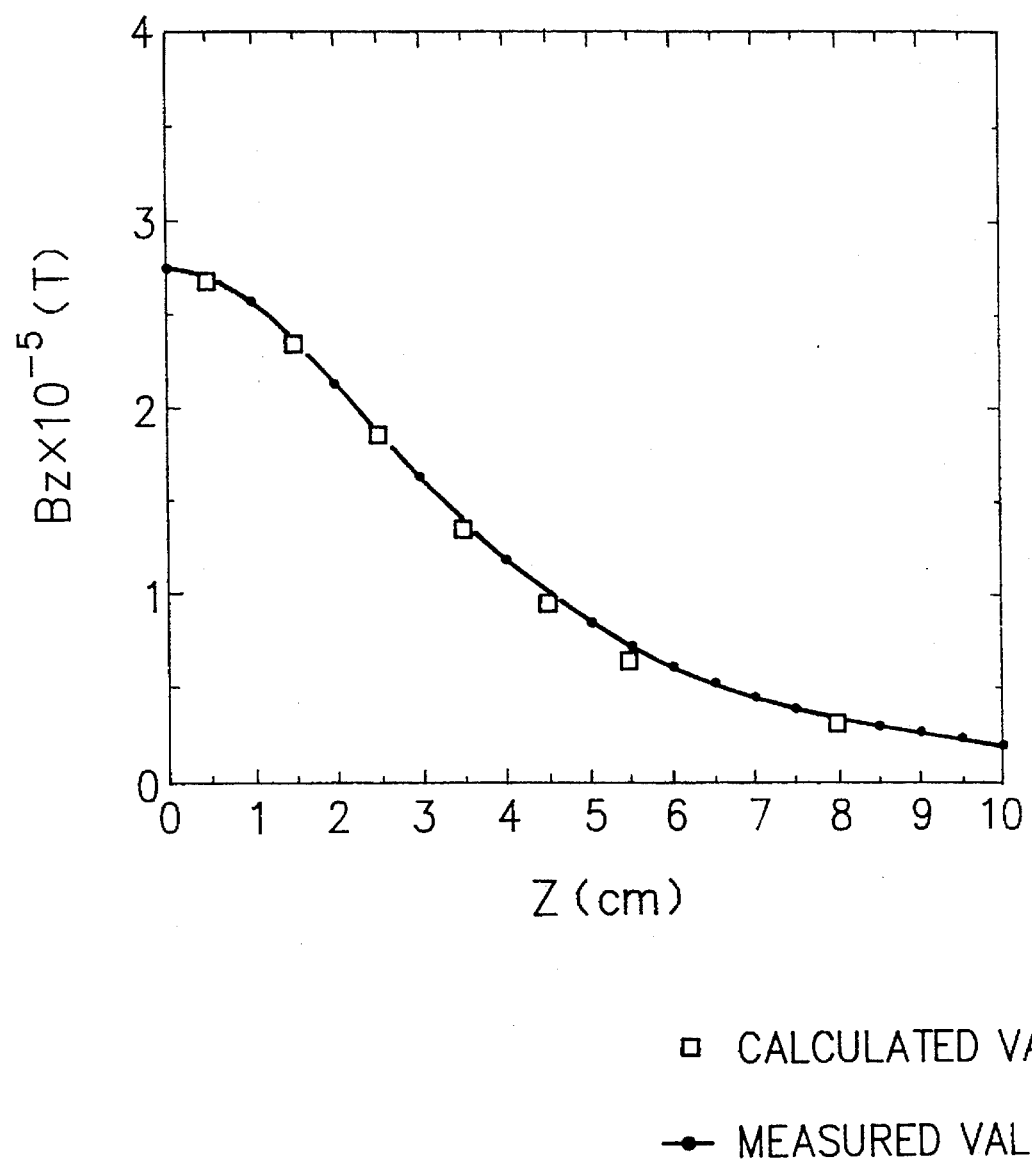
FIG. 18 is a graph for comparing calculated values with measured values according to the fifth embodiment of the present invention.
Figure 20:
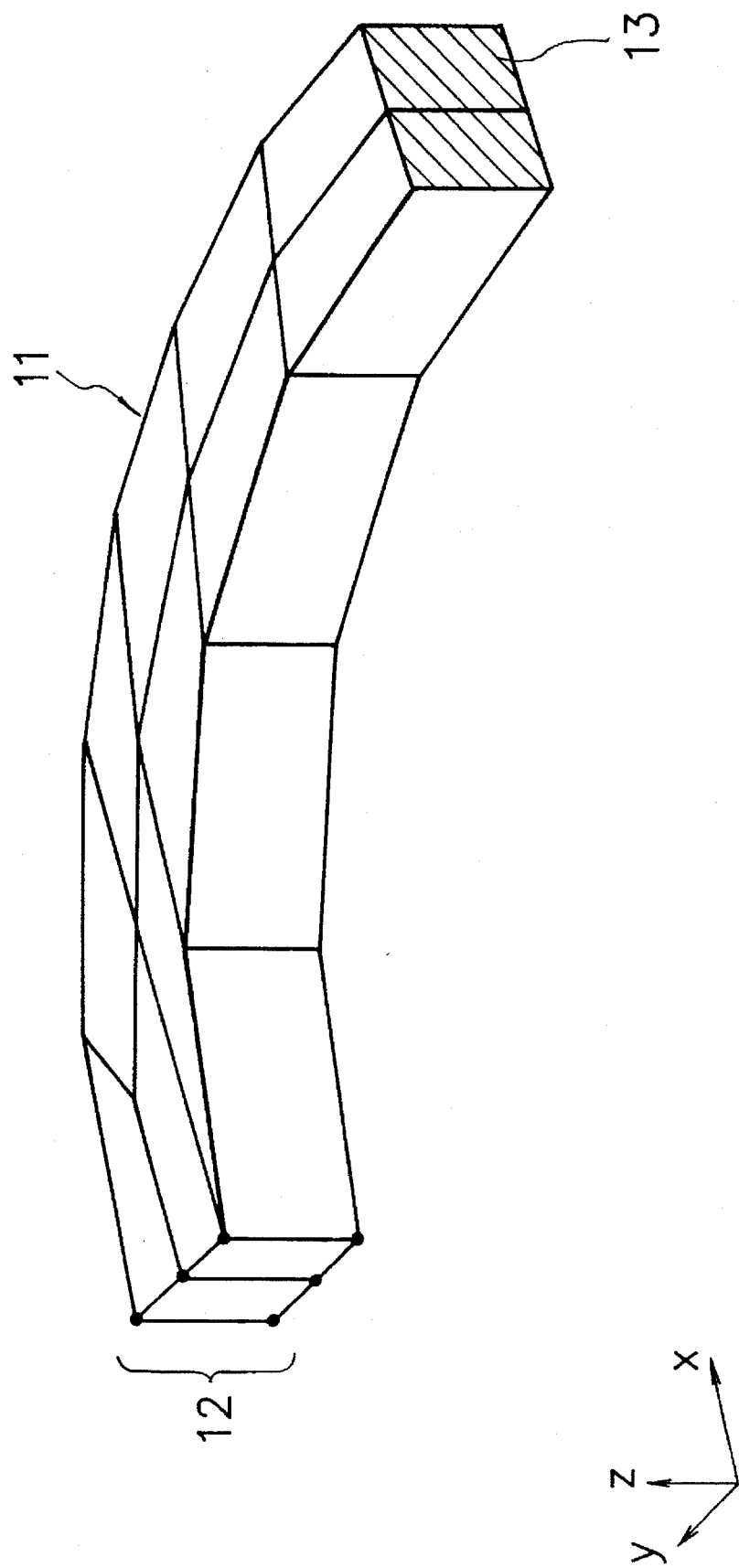
FIG. 20 is a view showing nodes in a divided electric conductor portion, at each of which an electric potential is applied as an initial condition according to the sixth embodiment of the present invention, and a cross section of the electric conductor portion, at which a current density is applied as an initial condition according to the embodiment.

A magnetic field generated by a ring-like electric conductor as in Example 4 was analyzed. The region of interest and the boundary conditions were identical to those in Example 4. In Example 5, the normal component of $10^4$ A/m² a current density was input at the surfaces of portions 12 and 13 (FIG. 17) as an initial condition. A current density vector distribution which met the condition of continuity of current was obtained by using a finite-element method for node elements. An electromagnetic field was analyzed by edge-element approximation on the basis of the current density vector distribution. Convergence (with a convergence determination value of $10^{-5}$) of the incomplete Cholesky conjugate gradient method used to solve simultaneous linear equations was obtained, and a result of the analysis shown in FIG. 18 was obtained. FIG. 18 shows the comparison between calculated values according to the present invention and measured values in the z-direction components of the magnetic flux density on the central axis. According to the method of the present invention, even if the ring-like electric conductor is relatively complicatedly divided, as shown in FIG. 17, the analysis can be performed. In addition, as shown in FIG. 18, the calculated values according to the present invention accurately coincide with the measured values, thereby accurately analyzing the magnetic field.

In this example, comprehensive simultaneous equations associated with the electric potential in the process for obtaining the current density vector distribution are solved by using the incomplete Cholesky conjugate gradient method. The convergence determination value which represented the accuracy of convergence in calculation was set to $10^{-8}$, and converged solutions with an increased accuracy were obtained. FIG. 19 shows the convergent state of the incomplete Cholesky conjugate gradient method in magnetic field calculations in this example when the accuracies of convergence of the comprehensive simultaneous equations associated with the electric potential in the current density vector calculations are $10^{-4}$ and $10^{-8}$. To obtain an aimed accuracy of convergence in the magnetic field calculation ($10^{-5}$ in this case), the calculation accuracy of convergence of the comprehensive simultaneous equations associated with the electric potential for calculating the current density vectors must be higher than the aimed accuracy of convergence in the magnetic field calculation.

EXAMPLE 6

A magnetic field generated by a ring-like electric conductor as in Example 4 was analyzed. The region of interest and the boundary conditions were identical to those in Example 4. In Example 6, an electric potential of 0 V was input as an initial condition to nodes at a portion 12 in FIG. 20 and the normal component $10^4$ A/m² of a current density was input as an initial condition on the surface at a portion 13 in FIG. 20. A current density vector distribution which met the condition of continuity of current was obtained by using a finite-element method for node elements. An electromagnetic field was analyzed by edge-element approximation on the basis of the current density vector distribution. Convergence (with a convergence determination value of $10^{-5}$) of the incomplete Cholesky conjugate gradient method used to solve simultaneous linear equations was obtained, and a result of the analysis as in FIG. 18 was obtained.

In this example, comprehensive simultaneous equations associated with the electric potential in the process for obtaining the current density vector distribution are solved by using the incomplete Cholesky conjugate gradient method. The convergence determination value which represented the accuracy of convergence in calculation was set to $10^{-8}$, and converged solutions with an increased accuracy were obtained. The convergent state of the incomplete Cholesky conjugate gradient method in magnetic field calculations was checked when the accuracies of convergence of the comprehensive simultaneous equations associated with the electric potential in the current density vector calculations were $10^{-4}$ and $10^{-8}$. The same result as in FIG. 19 was obtained in this example.

EXAMPLE 7

Figure 21:
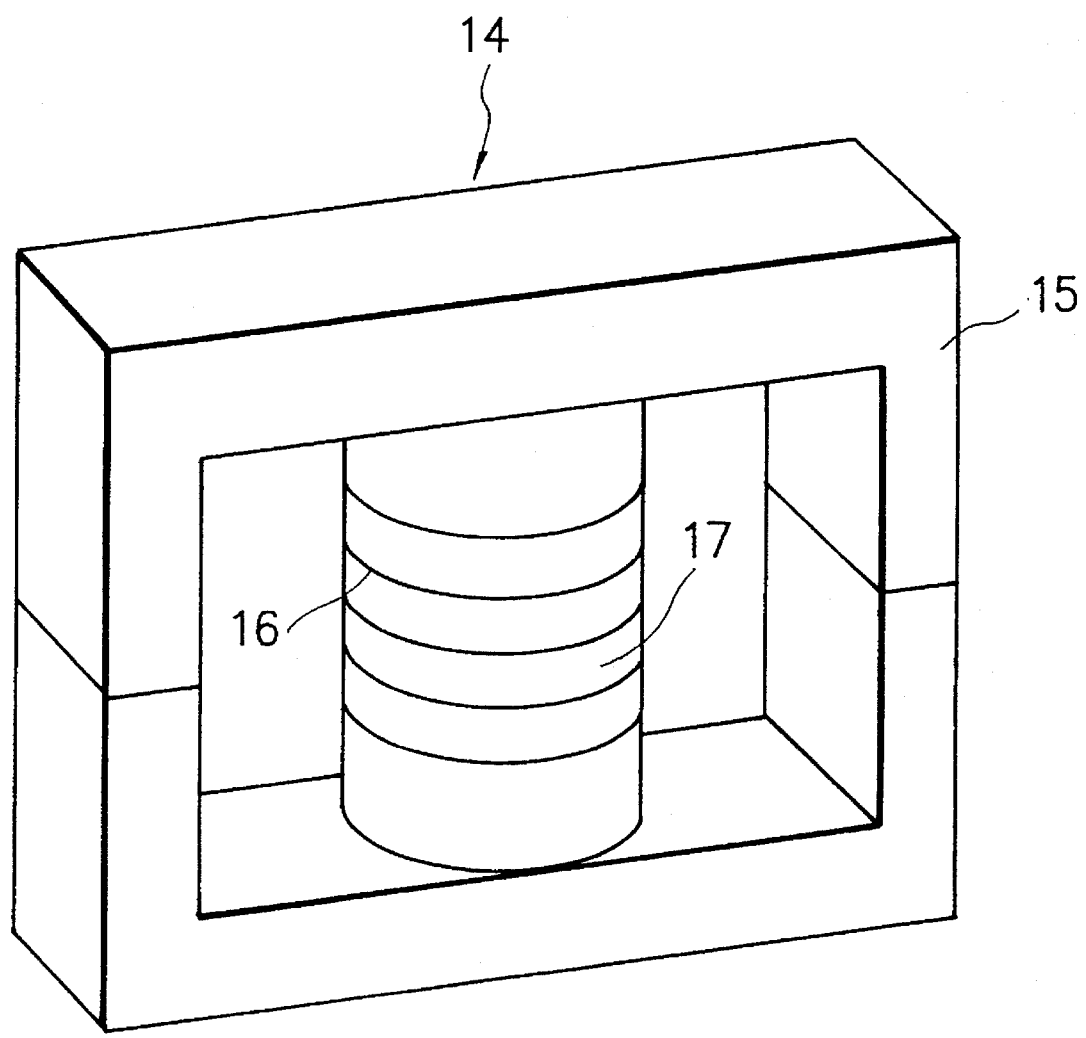
FIG. 21 is a perspective view showing the structure of a magnetic component to be analyzed according to the seventh to ninth embodiments of the present invention.
Figure 22:
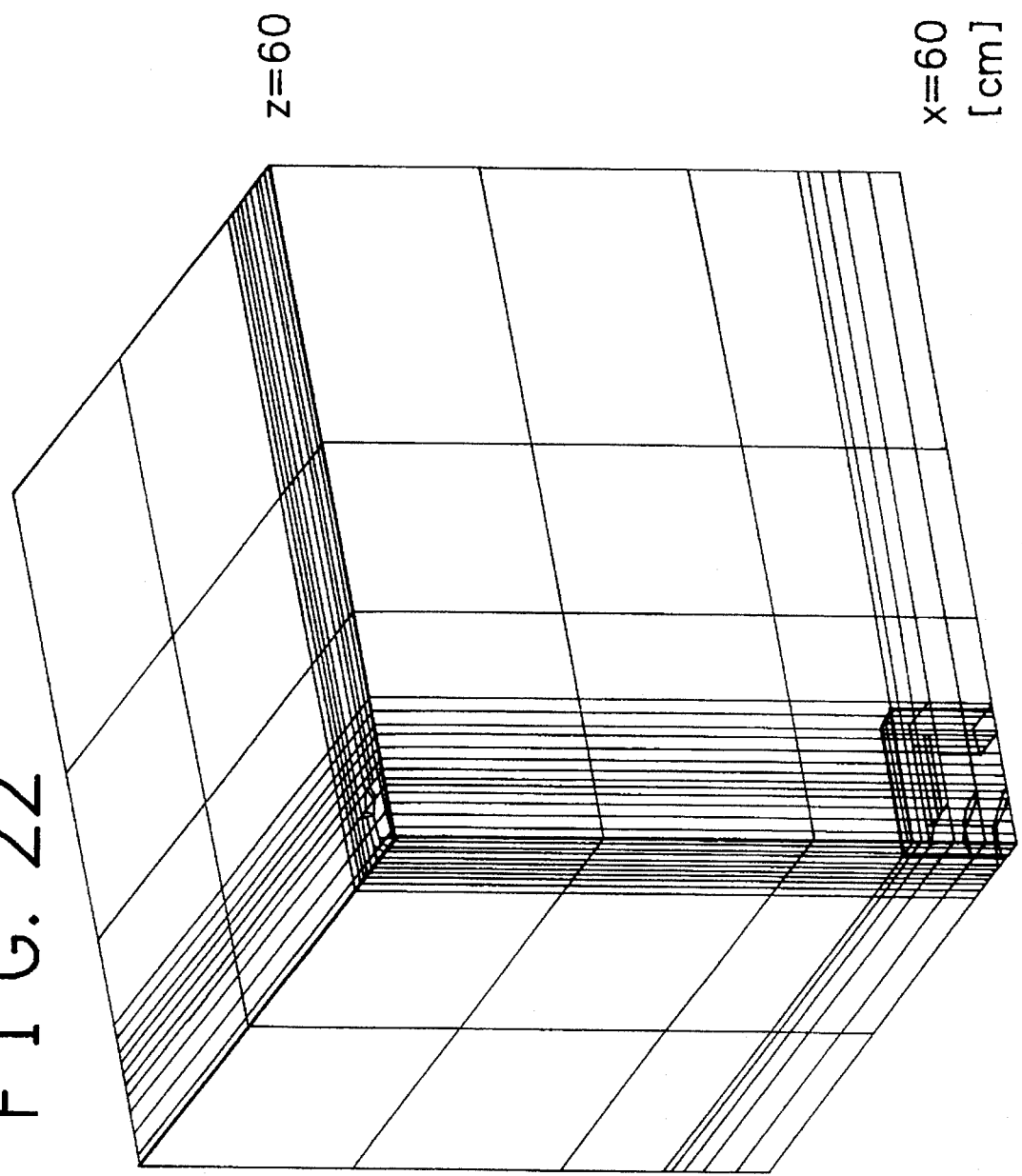
FIG. 22 is a view showing a region of interest according to the seventh to ninth embodiments of the present invention.

A magnetic component 14 shown in FIG. 21 was analyzed. This magnetic component 14 is a transformer used in, e.g., a switching power supply. Reference numeral 15 denotes a ferrite magnetic path; and 16, an electric conductor. The electric conductor 16 is wound around a core 17 in the magnetic component 14 to constitute a coil. A region of interest was a ⅛ region in view of the symmetry of the magnetic component 14. The region of interest was divided into elements, as shown in FIG. 22. Of all the elements in FIG. 22, elements shown in FIG. 23 constituted the portion of the electric conductor 16. Referring to FIG. 22, the planes of x=0 and y=0 have the symmetrical boundary condition wherein edges on those planes are zero. The planes of x=60, y=60, and z=60 have the zero boundary condition. The plane of z=0 has the natural boundary condition (unit: cm).

Physical property data of the magnetic material constituting the magnetic path 15 were initial magnetization characteristics of a ring-like sample consisting of the same material as the above magnetic material. The ring-like sample was used because the influence of demagnetizing field could be neglected and characteristics inherent to the material could be obtained. A measurement result of the initial magnetization characteristics (the relationship between the magnetic field H and the magnetic flux density B) is shown in FIG. 24.

In this Example, an electric potential which induced an aimed excitation current value was applied as an initial value to nodes at portions 18 and 19 of FIG. 23.

Figure 25:
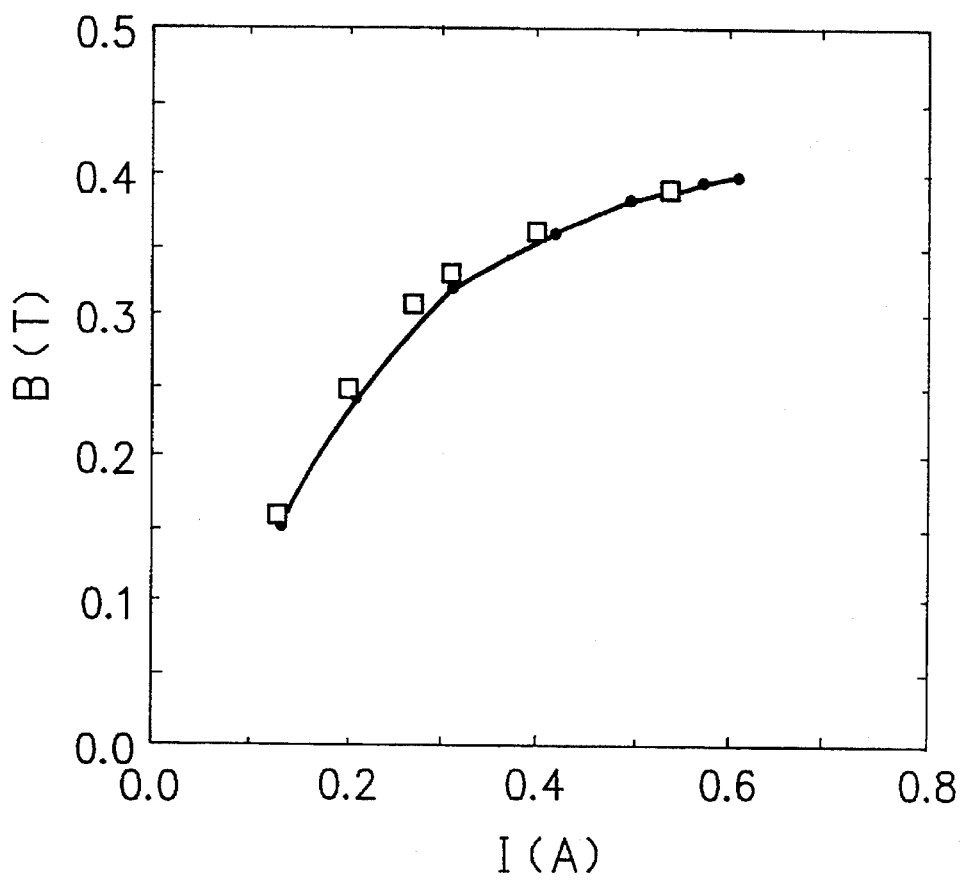
FIG. 25 is a graph for comparing calculated values with measured values according to the seventh embodiment of the present invention.
Figure 26:
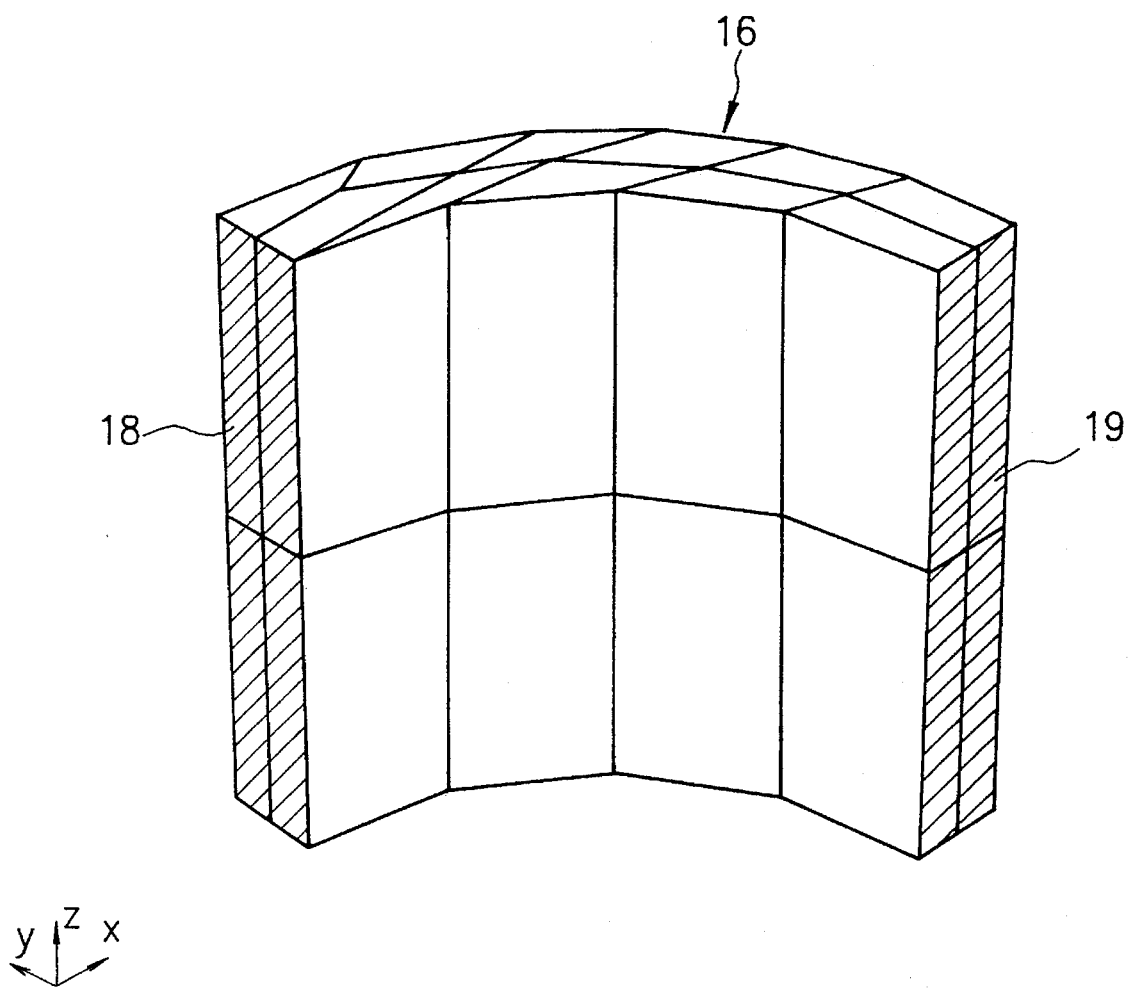
FIG. 26 is a view showing cross sections of a divided electric conductor, at each of which a current density is applied as an initial condition according to the eighth embodiment of the present invention.
Figure 27:
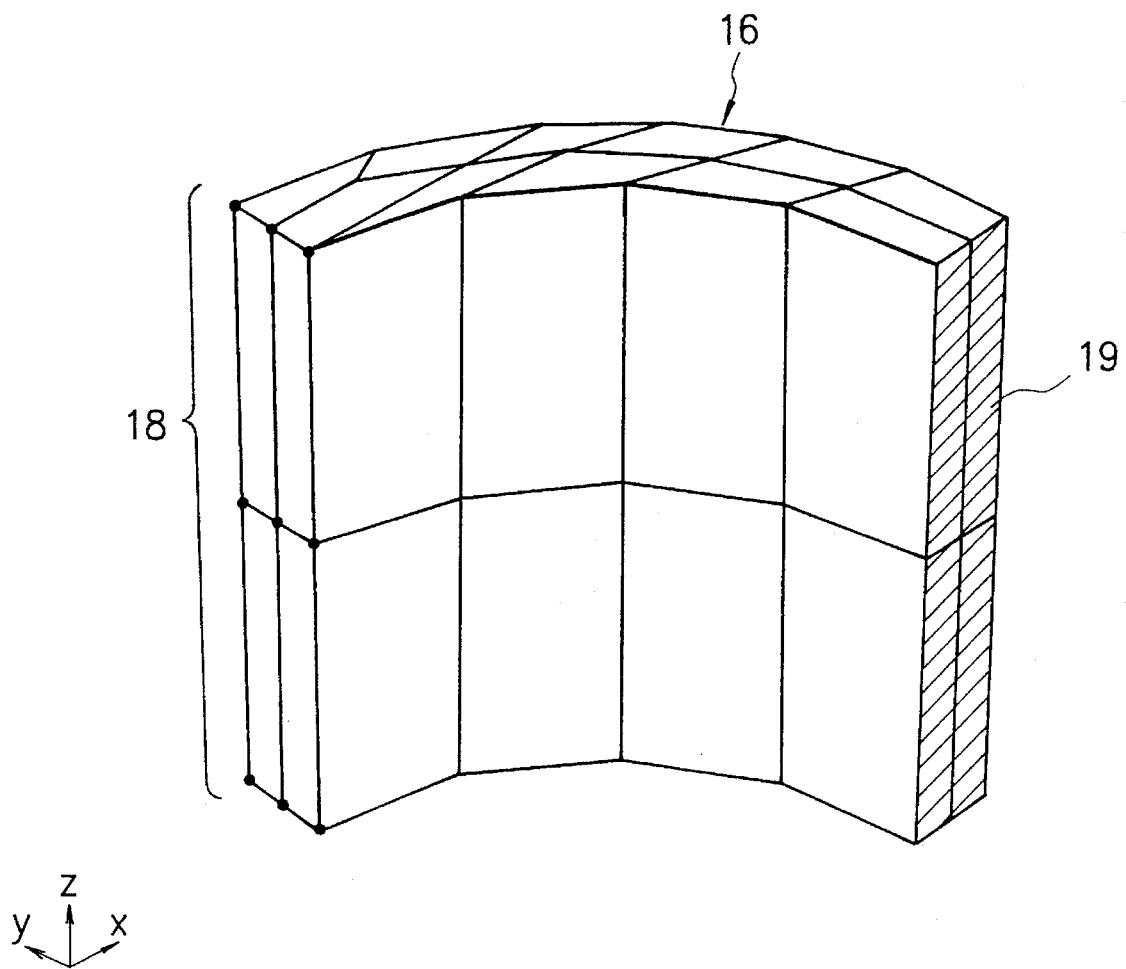
FIG. 27 is a view showing nodes in a divided electric conductor, at each of which an electric potential is applied as an initial condition according to the ninth embodiment of the present invention, and a cross section of the electric conductor, at which a current density is applied as an initial condition according to the embodiment.

An analysis according to the present invention was performed on the basis of the initial condition data described above. In a magnetic field calculation using edge-element approximation, Convergence (convergence determination value of $10^{-5}$) of the incomplete Cholesky conjugate gradient method used to solve simultaneous linear equations was obtained, and an analysis result shown in FIG. 25 was obtained. FIG. 25 shows a magnetic flux density generated in the core 17 of the magnetic component 14. A nonlinear iterative calculation was performed in consideration of nonlinearity of the initial magnetization characteristics of the magnetic material.

According to the method of the present invention, even if an electric conductor is complicatedly divided due to the presence of a core as shown in FIG. 23, the electromagnetic field can be analyzed. As shown in FIG. 25, the calculated values accurately coincide with the measured values. The magnetic field distribution necessary for design of a transformer can be accurately obtained.

EXAMPLE 8

A magnetic component 14 as in Example 7 was analyzed. The region of interest and the boundary conditions were identical to those in Example 7. The normal component of an excitation current density was applied to the surfaces of portions 18 and 19 in FIG. 26 as an initial condition.

An analysis according to the present invention was performed on the basis of the initial condition data described above. In a magnetic field calculation using edge-element approximation, Convergence (convergence determination value of $10^{-5}$) of the incomplete Cholesky conjugate gradient method used to solve simultaneous linear equations was obtained, and an analysis result as in FIG. 25 was obtained.

EXAMPLE 9

A magnetic component 14 as in Example 7 was analyzed. The region of interest and the boundary conditions were identical to those in Example 7. An electric potential was applied as an initial condition to nodes of a portion 18 in FIG. 27 and an excitation current density was applied to the surface of a portion 19 in FIG. 27 as an initial condition.

An analysis according to the present invention was performed on the basis of the initial condition data described above. In a magnetic field calculation using edge-element approximation, Convergence (convergence determination value of $10^{-5}$) of the incomplete Cholesky conjugate gradient method used to solve simultaneous linear equations was obtained, and an analysis result as in FIG. 25 was obtained.

EXAMPLE 10

As strong demand has arisen for a compact switching power supply, a magnetic component used in it must also be made compact. To examine the influence of miniaturization of each magnetic component, cores having different sizes must actually be prepared and examined hitherto. This, however, requires a long experiment time and cost in preparation of component samples. According to the method of Examples 7 to 9, the magnetic component 14 as shown in FIG. 21 and a magnetic component having the height half that of the magnetic component 14 were used to analyze the magnetic characteristics thereof to examine whether a transformer could be made compact. Under the same conditions, the difference between the magnetic flux densities of the cores of the above two magnetic components was as small as only about 9%. It was found that the magnetic flux density distribution of the magnetic component having the ½ height was not much different from that of the magnetic component 14. Therefore, it is found that no problem is posed even if the compact magnetic component is used in a transformer.

Figure 28:
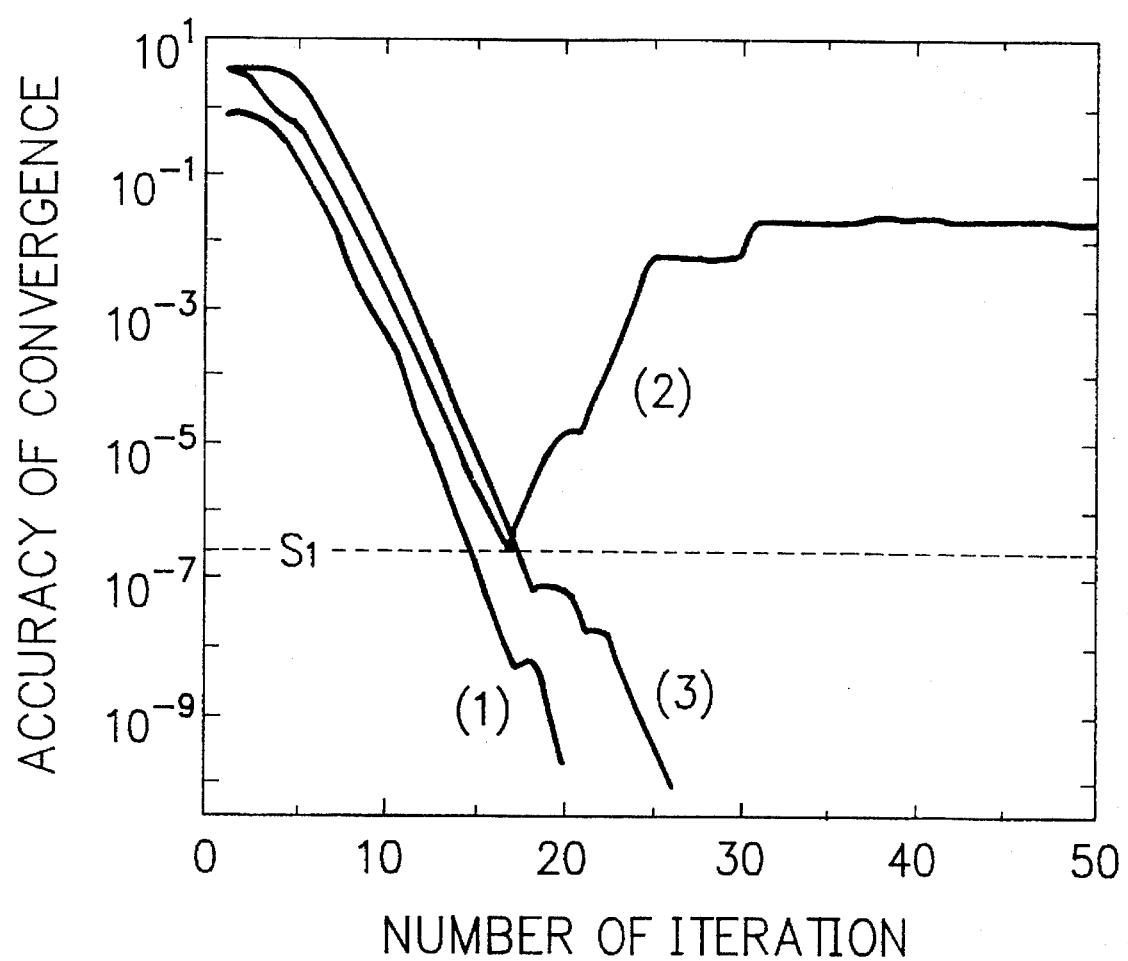
FIG. 28 is a graph showing comparison of convergent processes in calculations of the comprehensive simultaneous equations associated with electric potentials, which change depending on different initial conditions.

FIG. 28 is a graph showing calculation convergence processes by iteration methods for comprehensive simultaneous equations associated with the electric potential. Referring to FIG. 28, curve (1) represents a convergence process when an electric potential at a predetermined portion of an electric conductor is applied as an initial condition. Curve (2) represents a convergence process when a value of the normal component of a current density to the cross section at a predetermined portion of the electric conductor is applied as an initial condition. Curve (3) represents a convergence process when an electric potential at a predetermined portion of the electric conductor is applied as an initial condition and a value of the normal component of a current density to the cross section at another predetermined portion of the electric conductor is applied as an initial condition.

As can be apparent from FIG. 28, the convergence process represented by curve (2) has an accuracy of convergence lower than those of the convergence processes represented by curves (1) and (3). In the calculation of comprehensive simultaneous equations associated with the vector potential or an unknown variable equivalent thereto, to obtain an aimed accuracy of convergence, the accuracy of convergence in the calculation of the comprehensive simultaneous equations associated with the electric potential must be higher than the aimed accuracy of convergence. However, the convergence process represented by curve (2) has the minimum value $S_1$ of accuracy of convergence. For this reason, in case of curve (2), the calculation of the comprehensive simultaneous equations associated with the vector potential or an unknown variable equivalent thereto cannot obtain an accuracy of convergence higher than the accuracy given by the minimum value $S_1$. On the other hand, the convergence process represented by curve (1) can provide a sufficiently high accuracy of convergence. When a current density is used as an initial condition, however, the electric potential difference between both ends of the electric conductor must be determined from the value of the current density in consideration of the shape or the like of the electric conductor. It is troublesome to accurately convert the given current density into a value of electric potential because the cross section of the electric conductor is finite and the length of the electric conductor varies depending on the length measurement method. In the convergence process represented by curve (3), a value of the normal component of the current density is applied to the cross section of the predetermined portion as an initial condition, and a value of electric potential is applied to another predetermined portion as an initial condition. For this reason, the potential conversion as the case of curve (1) need not be performed.

When a value of electric potential at a predetermined portion of an electric conductor is applied as an initial condition and a value of a normal component of a current density to the cross section at another predetermined portion of the electric conductor is applied as an initial condition, as compared with the case of curve (1), the initial condition can be easily input. In addition, as compared with the case of curve (2), an electromagnetic field can be more accurately analyzed.

According to a method for analyzing an electromagnetic field according to the present invention, as has been described above, an electromagnetic field generated in an electronic or electric equipment (e.g., a transformer, a reactor, or a motor), in particular, an equipment having a complicated conductor structure, can be efficiently and accurately analyzed. Therefore, for designing an electronic or electric equipment or changing in specification thereof, it is not required to prepare its samples and conduct experiments in a trial-and-error manner.

What is claimed is:

1. A method for designing electrical equipment by creating a computer model of an electromagnetic field of a region a part of which comprises an electric conductor, said method comprising: initializing a central processing unit of a computer, inputting into said central processing unit electric potential information representing electric potential at a predetermined portion of said electric conductor as an initial condition, ascertaining within said central processing unit the distribution of exciting current density vectors in said electric conductor on the basis of said electric potential information so as to meet the condition of continuity of electric current, and transforming said electric potential information on the basis of said distribution of exciting current density vectors into a computer model of the electromagnetic field of the region, said electromagnetic field comprising at least one of magnetic flux density distribution, magnetic field, electric field and eddy current density distribution of said region, and designing electrical equipment in accordance with said computer model.

2. A method for designing electrical equipment by creating a computer model of an electromagnetic field of a region a part of which comprises an electric conductor, said method comprising: initializing a central processing unit of a computer, inputting into said central processing unit at least one of electric potential information representing electric potential at a predetermined portion of said electric conductor and absolute value information representing the absolute value of an electric current density vector normal to an equipotential cross section of said electric conductor as an initial condition, ascertaining within said central processing unit the distribution of exciting current density vectors in said electric conductor on the basis of at least one of said electric potential information and said absolute value information so as to meet the condition of continuity of electric current, and transforming at least one of said electric potential information and said absolute value information on the basis of said distribution of exciting current density vectors into a computer model of the electromagnetic field of the region, said electromagnetic field comprising at least one of magnetic flux density distribution, magnetic field, electric field and eddy current density distribution of said region, and designing electrical equipment in accordance with said computer model.

3. A method for designing electrical equipment by creating a computer model of an electromagnetic field according to claim 1, in which an electric potential of a predetermined equipotential cross section of said electric conductor is used as said initial condition.

4. A method for designing electrical equipment by creating a computer model of an electromagnetic field according to claim 3, in which the absolute value of an electric current density vector normal to said cross section is used as said initial condition.

5. A method for designing electrical equipment by creating a computer model of an electromagnetic field according to claim 4, in which an electric potential at a predetermined portion of said electric conductor and the absolute value of an electric current density vector normal to a predetermined equipotential cross section of said electric conductor are used as said initial condition, said predetermined equipotential cross section not including said predetermined portion.

6. A method for designing electrical equipment by creating a computer model of an electromagnetic field according to claim 2, in which electric potentials at two predetermined portions of said electric conductor are used as initial conditions, respectively.

7. A method for designing electrical equipment by creating a computer model of an electromagnetic field according to claim 2, in which the absolute values of electric current density vectors normal to two predetermined equipotential cross sections of said electric conductor are used as initial conditions, respectively.

8. A method for designing electrical equipment by creating a computer model of an electromagnetic field according to claim 2, in which an electric potential at a predetermined portion of said electric conductor and the absolute value of a current density vector normal to a predetermined equipotential cross section not including said predetermined portion are used as initial conditions.

* * * * *